United States Patent
Ohnuma et al.

(10) Patent No.: US 8,288,215 B2
(45) Date of Patent: Oct. 16, 2012

(54) SEMICONDUCTOR DEVICE AND METHOD FOR MANUFACTURING THE SAME

(75) Inventors: Hideto Ohnuma, Atsugi (JP); Noritsugu Nomura, Kurume (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/069,468

(22) Filed: Mar. 23, 2011

(65) Prior Publication Data
US 2011/0171791 A1 Jul. 14, 2011

Related U.S. Application Data

(63) Continuation of application No. 12/420,887, filed on Apr. 9, 2009, now Pat. No. 7,939,389.

(30) Foreign Application Priority Data

Apr. 18, 2008 (JP) ................................. 2008-109180

(51) Int. Cl.
*H01L 21/336* (2006.01)

(52) U.S. Cl. ........ 438/164; 438/457; 438/458; 438/459; 438/517

(58) Field of Classification Search ............... 438/29, 438/455, 458, 480
See application file for complete search history.

(56) References Cited

U.S. PATENT DOCUMENTS

| | | | |
|---|---|---|---|
| 5,374,564 A | 12/1994 | Bruel | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,534,380 B1 | 3/2003 | Yamauchi et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,473,971 B2 | 1/2009 | Yamazaki et al. | |
| 7,476,576 B2 | 1/2009 | Yamazaki et al. | |

(Continued)

FOREIGN PATENT DOCUMENTS

JP 07-106579 4/1995

(Continued)

*Primary Examiner* — Mamadou Diallo
(74) *Attorney, Agent, or Firm* — Eric J. Robinson; Robinson Intellectual Property Law Office, P.C.

(57) ABSTRACT

A single crystal semiconductor substrate including an embrittlement layer is attached to a base substrate with an insulating layer interposed therebetween, and the single crystal semiconductor layer is separated at the embrittlement layer by heat treatment; accordingly, a single crystal semiconductor layer is fixed over the base substrate. The single crystal semiconductor layer is irradiated with a laser beam so that the single crystal semiconductor layer is partially melted and then is re-single crystallized, whereby crystal defects are removed. In addition, an island-shaped single crystal semiconductor layer for forming an n-channel transistor is channel-doped using a photomask and then is etched back using the photomask so that the island-shaped single crystal semiconductor layer for forming an n-channel transistor is thinner than the island-shaped single crystal semiconductor layer for forming a p-channel transistor.

25 Claims, 15 Drawing Sheets

U.S. PATENT DOCUMENTS

| | | |
|---|---|---|
| 7,535,053 B2 | 5/2009 | Yamazaki |
| 7,619,250 B2 | 11/2009 | Takafuji et al. |
| 7,625,786 B2 | 12/2009 | Makita et al. |
| 7,666,757 B2 | 2/2010 | Ohnuma |
| 7,767,542 B2 | 8/2010 | Ohnuma et al. |
| 7,820,524 B2 | 10/2010 | Miyairi et al. |
| 7,829,432 B2 | 11/2010 | Ohnuma et al. |
| 2007/0108510 A1 | 5/2007 | Fukunaga |
| 2007/0173000 A1 | 7/2007 | Yamazaki |
| 2007/0291022 A1 | 12/2007 | Yamazaki et al. |
| 2008/0254560 A1 | 10/2008 | Yamazaki |

FOREIGN PATENT DOCUMENTS

| | | |
|---|---|---|
| JP | 11-097379 | 4/1999 |
| JP | 11-163363 | 6/1999 |
| JP | 2004-087606 | 3/2004 |
| JP | 2005-252244 | 9/2005 |

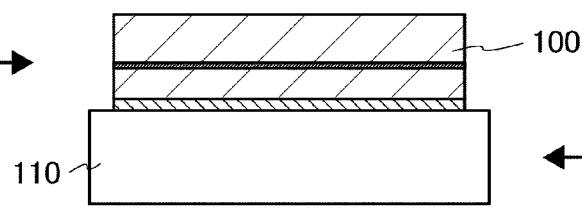
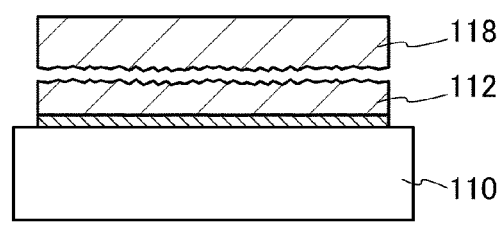
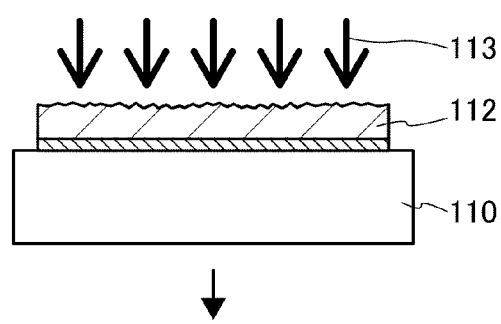
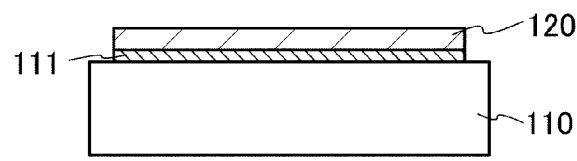

p0: −0.30 V
p1: −0.225 V
p2: −0.15 V
p3: −0.075 V
p4: 0 V

Condition 1

Condition 2 p0: −0.30 V
p1: −0.225 V
p2: −0.15 V
p3: −0.075 V
p4: 0 V

SEMICONDUCTOR DEVICE AND METHOD FOR MANUFACTURING THE SAME

BACKGROUND OF THE INVENTION

1. Field of the Invention

The present invention relates to semiconductor devices and methods for manufacturing the semiconductor devices. The present invention particularly relates to a semiconductor device which uses a single crystal semiconductor film formed by a hydrogen ion introduction separation method and a method for manufacturing the same.

2. Description of the Related Art

In recent years, integrated circuits using a silicon-on-insulator (SOI) substrate where a thin single crystal semiconductor film is present over an insulating surface, instead of using a bulk silicon wafer, have been developed. By utilizing characteristics of a thin single crystal silicon layer formed over an insulating film, transistors formed in the integrated circuit can be separated from each other completely. Further, since fully-depleted transistors can be formed, a semiconductor integrated circuit with high added value such as high integration, high speed driving, and low power consumption can be realized.

As a manufacturing method of an SOI substrate, a hydrogen ion introduction separation method in which hydrogen ion introduction and separation are combined is known. A manufacturing method of an SOI substrate using a hydrogen ion introduction separation method is briefly described below. First, by introduction of hydrogen ions into a silicon wafer serving as a substrate for separation by an ion introduction method, an ion-introduced layer is formed at a predetermined depth from the surface. Then, the silicon wafer into which the hydrogen ions are introduced is bonded to another silicon wafer with a silicon oxide film interposed therebetween (bonding). After that, by heat treatment, the ion-introduced layer serves as a cleavage plane, and the silicon wafer for separation, into which the hydrogen ions have been introduced, is separated as a thin film, whereby a single crystal silicon film can be formed over the another silicon wafer. The hydrogen ion introduction separation method is also called a Smart Cut (registered trademark) method.

A method in which a single crystal silicon film is formed over a base substrate made of glass or the like by a hydrogen ion introduction separation method has been proposed (for example, Reference 1: Japanese Published Patent Application No. H11-097379, and Reference 2: Japanese Published Patent Application No. 2005-252244). In Reference 1, a separation plane is mechanically polished in order to remove a defect layer formed by ion introduction or a step of the separation plane, which is several to several tens of nanometers in height. In Reference 2, after the separation step, laser beam irradiation is performed to improve crystal quality of the semiconductor thin film layer and to strongly bond the semiconductor thin film layer and the transparent insulating substrate.

SUMMARY OF THE INVENTION

In the case of forming a single crystal semiconductor film by an ion introduction separation method, defects increase in the single crystal semiconductor film by the ion introduction. In the case where a large number of defects exist in the single crystal semiconductor film, a defect level is likely to be formed at an interface with a gate insulating film. Accordingly, characteristics of a semiconductor element manufactured using the single crystal semiconductor film is not favorable.

Conventionally, a crystal defect of a semiconductor film which is attached to a silicon wafer has been removed by heating at high temperature (e.g., 800° C. or higher). However, when a glass substrate is used as a base substrate, an inexpensive SOI substrate having a large area can be manufactured, while such a high-temperature process cannot be used to remove a crystal defect of a single crystal semiconductor film since the glass substrate has low heat resistance (a strain point of 700° C. or lower).

In Reference 2, a method in which crystallinity of a single crystal semiconductor film is improved by irradiating the single crystal semiconductor film after separation with a laser beam is proposed. A crystal defect can be removed by the laser irradiation but a carrier trap is generated if the removal is not enough.

Such a carrier trap affects the subthreshold swing (S value) when a transistor is formed using the single crystal semiconductor film. In a graph showing a relation between a gate voltage Vg and a drain current Id, an S value is a coefficient of a rising part of the Id-Vg curve (in a subthreshold region of a transistor) and represents a slope of the graph at a point where the drain current Id rises sharply. In other words, the S value indicates change in gate voltage when the drain current Id increases. A smaller S value means more preferable characteristics.

An object of one embodiment of the present invention is to provide a semiconductor device in which a glass substrate is used as a base substrate and the S value of a transistor including a single crystal semiconductor film formed by an ion introduction separation method is small, and a method for manufacturing the semiconductor device. Further, another object of one embodiment of the present invention is to provide a semiconductor device in which a glass substrate is used as a base substrate and a single crystal semiconductor layer has favorable crystallinity in a transistor in which the semiconductor layer is formed by an ion introduction separation method, and a method for manufacturing the semiconductor device.

A semiconductor device which is one embodiment of the present invention includes transistors which use a single crystal semiconductor film formed by a hydrogen ion introduction separation method. In particular, treatment of grow a crystal in an upper portion of the single crystal semiconductor film so that the crystallinity of the upper portion is matched to that of a lower portion is performed in such a manner that the single crystal semiconductor film is irradiated with a laser beam to melt the upper portion (hereinafter also referred to as laser partial melting treatment). In addition, the transistors are an n-channel transistor including a single crystal silicon film having a first thickness and a p-channel transistor including a single crystal silicon film having a second thickness that is larger than the first thickness. With this structure, favorable crystallinity can be obtained by laser partial melting treatment, while the S value can be made small.

The present inventors formed an n-channel transistor and a p-channel transistor in such a manner that a single crystal silicon film is formed over a base substrate formed including glass or the like by a hydrogen ion introduction separation method and laser partial melting treatment is performed. When characteristics of the n-channel transistor and the p-channel transistor are compared with each other, the n-channel transistor has a larger S value. However, it was found that when the single crystal semiconductor layer is thinned after the laser partial melting treatment, the S value of the n-channel transistor is likely to decrease, while on the other hand, the S value of the p-channel transistor is likely to increase. Generally, the S value is likely to decrease when an active layer is thinner. The present inventors analyzed the above-mentioned difference between the n-channel transistor and the p-channel transistor as follows. In the vicinity of the interface of the active layer near the substrate, there are many defects which generate hole traps. Since holes, the majority carriers in the p-channel transistor, affect the p-channel transistor, when the active layer is thinned, a defect in the vicinity of the interface with the lower portion affects p-channel transistor characteristics. On the other hand, the majority carriers are electrons in the n-channel transistor, and even if the active layer is thinned, p-channel transistor characteristics are little affected. Therefore, when the active layer is thinned, the S value of only the p-channel transistor increases.

Further, the present inventors considered that the correlation between the S value and the thickness of the single crystal semiconductor layer is different between the n-channel transistor and the p-channel transistor because of the formation method of the single crystal semiconductor layer. It is generally said that a crystal defect which serves as a hole trap is generated by hydrogen doping, and the present inventors thought that this is because a crystal defect which is generated by hydrogen doping and serves as a hole trap would exist in a region on the bonding plane side of the single crystal semiconductor layer. In other words, the present inventors thought in the following way. A single crystal semiconductor layer formed by a hydrogen ion introduction separation method includes crystal defects, and a defect can be removed in a surface layer of the single crystal semiconductor layer by laser partial melting treatment; however, a defect cannot be removed in the single crystal semiconductor layer in a region near a base substrate, which is not melted by the laser partial melting treatment. Then, the crystal defect serves as a hole trap; accordingly, as thinning advances and a channel region is closer to the hole trap, the S value increases only in a p-channel transistor whose characteristics are likely to be affected by a hole trap.

From such consideration, the present inventors thought that by subjecting an n-channel transistor to thinning treatment (also referred to as etch-back), the n-channel transistor and a p-channel transistor can each have a small S value. As a process for obtaining a small S value, for example, an active layer of an n-channel transistor can be subjected to thinning treatment after laser partial melting treatment and a p-channel transistor can be subjected to thinning treatment only before the laser partial melting treatment.

The thicknesses of a single crystal semiconductor film used for an n-channel transistor and a single crystal semiconductor film used for a p-channel transistor, which are both formed by an ion introduction separation method, are each controlled. Accordingly, a semiconductor device in which the S value is small and a method for manufacturing the semiconductor device can be provided.

By using laser partial melting treatment in manufacturing a transistor in which a single crystal semiconductor film is formed by an ion introduction separation method, a semiconductor device including a semiconductor layer with favorable crystallinity and a method for manufacturing the semiconductor device can be provided.

BRIEF DESCRIPTION OF THE DRAWINGS

In the accompanying drawings:
FIGS. 1A to 1F illustrate a manufacturing process of a semiconductor device.

DETAILED DESCRIPTION OF THE INVENTION

Embodiment 1

Figure 2A:
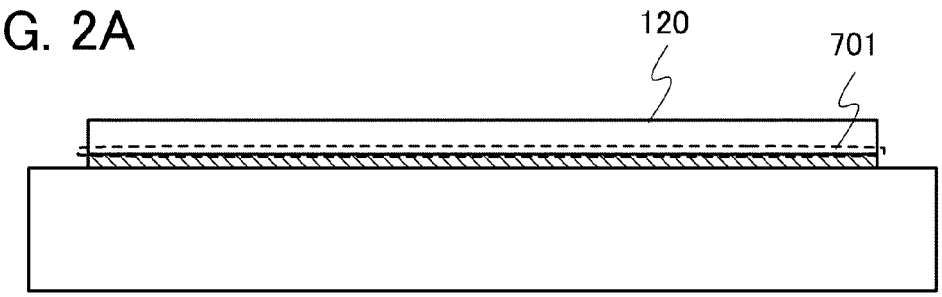
FIGS. 2A to 2D illustrate a manufacturing process of a semiconductor device.
Figure 2B:
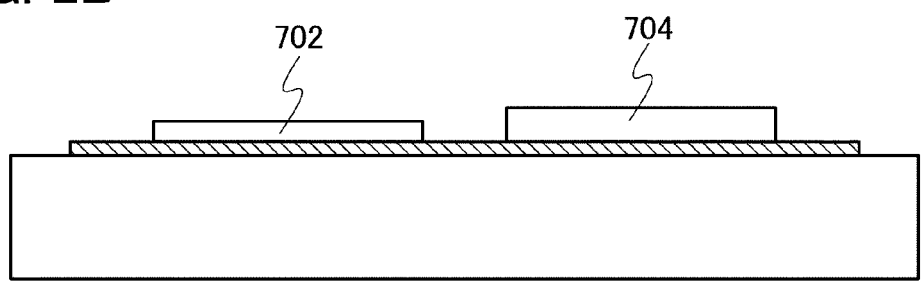

In Embodiment 1, a manufacturing method of a semiconductor device according to an embodiment of the present invention will be described with reference to FIGS. 1A to 1F, FIGS. 2A to 2D, FIGS. 3A to 3D, and FIGS. 4A and 4B.

First, a base substrate (also referred to as a supporting substrate) 110 is prepared (see FIG. 1A). As the base substrate 110, a light-transmitting glass substrate used for liquid crystal display devices or the like can preferably be used. As a glass substrate, a substrate having a strain point of higher than or equal to 580° C. and lower than or equal to 680° C. (preferably, higher than or equal to 600° C. and lower than or equal to 680° C.) may be used. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that as the base substrate 110, a substrate including an insulator such as a ceramic substrate, a quartz substrate, or a sapphire substrate; a substrate including a semiconductor material such as silicon; a substrate including a conductor material such as a metal or stainless steel; or the like can be used instead of the glass substrate.

Although not described in this embodiment, an insulating layer may be formed over a surface of the base substrate 110. In the case where impurities (such as an alkali metal or an alkaline-earth metal) are included in the base substrate 110, the insulating layer can prevent diffusion of the impurities into a semiconductor layer. The insulating layer may have either a single-layer structure or a stacked structure. As a material for forming the insulating layer, silicon oxide, silicon nitride, silicon oxynitride, silicon nitride oxide, or the like can be used.

Next, a single crystal semiconductor substrate 100 is prepared. As the single crystal semiconductor substrate 100, for example, a single crystal semiconductor substrate including a Group 14 element such as silicon, germanium, silicon germanium, or silicon carbide can be used. Needless to say, a substrate including a compound semiconductor such as gallium arsenide or indium phosphide may also be used. In this embodiment, a single crystal silicon substrate is used as the single crystal semiconductor substrate 100. Although there is no limitation on the shape and the size of the single crystal semiconductor substrate 100, for example, a circular semiconductor substrate having a diameter of 8 inches (200 mm), 12 inches (300 mm), or 18 inches (450 nm) can be processed into a rectangular shape for being used as the single crystal semiconductor substrate 100. Note that in this specification, a "single crystal" has certain regularity in its crystal structure and crystal axes are oriented in the same direction in any portion. That is, the "single crystal" is defined regardless of the number of defects in the present invention.

After the single crystal semiconductor substrate 100 is cleaned, an insulating layer is formed over a surface of the single crystal semiconductor substrate 100. Although the insulating layer is not always provided, the insulating layer is preferably provided in order to prevent contamination of the single crystal semiconductor substrate 100 and damages to the surface due to ion introduction to be performed later.

Next, an ion beam including ions accelerated by an electric field is introduced into the single crystal semiconductor substrate 100, through the insulating layer, and an embrittlement region 102 is formed in a region at a predetermined depth from the surface of the single crystal semiconductor substrate 100. The depth of the region where the embrittlement region 102 is formed can be controlled by the accelerating energy of the ion beam and the incidence angle thereof. Here, the embrittlement region 102 is formed in a region at a depth the same or substantially the same as the average penetration depth of the ions.

The thickness of the semiconductor layer which is separated from the single crystal semiconductor substrate 100 depends on the depth at which the embrittlement region 102 is formed. The depth at which the embrittlement region 102 is formed is greater than or equal to 50 nm and less than or equal to 500 nm from the surface of the single crystal semiconductor substrate 100, and is preferably greater than or equal to 50 nm and less than or equal to 200 nm. If the embrittlement region 102 is formed deeper or shallower than the above-described depth, the semiconductor layer to be separated becomes too thick or too thin. When the semiconductor layer to be separated is too thick, the thickness of the semiconductor layer is unsuitable for the transistor to be formed. When the semiconductor layer to be separated is too thin, the thin semiconductor layer may cause a defect when being separated from the single crystal semiconductor substrate 100.

In introducing the single crystal semiconductor substrate 100 with ions, an ion implantation apparatus or an ion doping apparatus can be used. In an ion implantation apparatus, a source gas is excited to produce ion species, the produced ion species are mass-separated, and ion species each having a predetermined mass are implanted in a process object. In an ion doping apparatus, a source gas is excited to produce ion species, and the ion species are introduced into a process object without mass-separating the produced ion species. In an ion doping apparatus provided with a mass separator, ion implantation with mass separation can be performed similarly to the ion implantation apparatus. In this specification, the use of one of an ion implantation apparatus and an ion doping apparatus is specified only in the case where one of them needs to be used, whereas in the case where there is not specific description, either of them may be used to perform ion introduction.

An ion introduction step in the case of using an ion doping apparatus can be performed under the following conditions, for example.

Accelerating voltage is higher than or equal to 10 kV and lower than or equal to 100 kV (preferably higher than or equal to 30 kV and lower than or equal to 80 kV)

Dose is higher than or equal to $1\times10^{16}$ ions/cm$^2$ and lower than or equal to $4\times10^{16}$ ions/cm$^2$ Beam current density is 2 μA/cm$^2$ or higher (preferably, 5 μA/cm$^2$ or higher, and more preferably, 10 μA/cm$^2$ or higher)

In the case of using an ion doping apparatus, a gas containing hydrogen can be used as a source gas for an ion introduction step. With the gas containing hydrogen, $H^+$, $H_2^+$ and $H_3^+$ can be produced as ion species. In the case where the gas containing hydrogen is used as a source gas, it is preferable to introduce a large amount of $H_3^+$. Specifically, it is preferably that the ion beam contains $H_3^+$ ions at a proportion of 70% or higher with respect to the total number of $H^+$, $H_2^+$, and $H_3^+$ ions. It is more preferable that the proportion of $H_3^+$ ions be equal to or higher than 80%. By increasing the proportion of $H_3^+$ ions in this manner, the embrittlement region 102 can contain hydrogen at a concentration of higher than or equal to $1\times10^{20}$ atoms/cm$^3$ by introducing a small number of ions. Accordingly, separation along the embrittlement region 102 can be facilitated. By irradiation with a large amount of $H_3^-$ ions, efficiency of the ion introduction can be improved compared to the introduction of $H^+$ and $H_2^+$. In other words, time required for ion introduction can be shortened.

When the ion implantation apparatus is used, it is preferable to implant $H_3^+$ ions through mass separation. Of course, $H_2^+$ ions may be implanted. Note that, in the case of using an ion implantation apparatus, efficiency of the ion introduction may be reduced compared to the case of using an ion doping apparatus. This is because ion species are selectively implanted.

After the formation of the embrittlement region 102, the insulating layer is removed, and another insulating layer 111 is formed (see FIG. 1B). The insulating layer is removed here because the insulating layer is highly likely to be damaged in the ion introduction step. If damage of the insulating layer formed before the formation of the embrittlement region 102 does not cause any problems, it is not necessary to remove the insulating layer and the insulating layer formed before the formation of the embrittlement region 102 may be used as the insulating layer 111 without additionally forming the insulating layer 111.

The insulating layer 111 is a layer to form bonding when substrates are attached, and thus the surface of the insulating layer 111 preferably has high planarity. As the insulating layer 111, a silicon oxide film formed by a chemical vapor deposition method using an organosilane gas can be used, for example. Note that the insulating layer 111 has a single-layer structure in this embodiment; however, it may have a stacked structure of two or more layers.

The insulating layer 111 may also be formed in such a manner that the single crystal semiconductor substrate 100 is subjected to heat treatment under an oxidizing atmosphere. Alternatively, the insulating layer 111 may be formed in such a manner that the single crystal semiconductor substrate 100 is subjected to heat treatment under an oxidizing atmosphere before formation of the embrittlement region 102. As thermal oxidation treatment, oxidation in an oxidizing atmosphere to which halogen is added is preferably performed. The insulating layer formed by thermal oxidation in which halogen is added to an oxidizing atmosphere contains halogen. By containing halogen at a concentration of higher than or equal to $1\times10^{16}$ atoms/cm$^3$ and lower than or equal to $2\times10^{21}$ atoms/cm$^3$, the insulating layer can serve as a protective film which captures impurities such as an alkali metal and prevents contamination of the single crystal semiconductor substrate 100.

Then, the above-described base substrate 110 and the single crystal semiconductor substrate 100 are attached to each other (see FIG. 1C). Specifically, after cleaning the surfaces of the base substrate 110 and the insulating layer 111 by a method such as ultrasonic cleaning, the surface of the base substrate 110 and the surface of the insulating layer 111 are disposed to be in contact with each other. Then, pressure treatment is performed so that the surface of the base substrate 110 and the surface of the insulating layer 111 are bonded to each other (formation of bonding). Hydrogen bonding and van der Waals force seem to act on this formation of bonding.

Before the bonding step, the surface of the base substrate 110 or the surface of the insulating layer 111 may be subjected to oxygen plasma treatment or ozone treatment so as to be hydrophilic. By this treatment, a hydroxyl is added to the surface of the base substrate 110 or the surface of the insulating layer 111, so that a hydrogen bond can be formed efficiently.

Next, heat treatment is performed on the base substrate 110 and the single crystal semiconductor substrate 100 which are bonded to each other, whereby the bonding becomes stronger. The heat temperature at this time needs to be a temperature that does not promote separation at the embrittlement region 102. For example, a temperature lower than 400° C., more preferably equal to or lower than 300° C. can be employed. The heat treatment time is not particularly limited and the optimal condition may be determined as appropriate from the relation between the treatment speed and the bonding strength. In this embodiment, heat treatment is performed at 200° C. for 2 hours. At this time, the substrates can also be heated locally by irradiating only a region relating to the bonding of the substrates with microwave. Note that when there is no problem with the bonding strength of the substrates, the heat treatment may be omitted.

Next, the single crystal semiconductor substrate 100 is separated into a single crystal semiconductor layer 112 and a single crystal semiconductor substrate 118 at the embrittlement region 102 (see FIG. 1D). The separation of the single crystal semiconductor substrate 100 is performed using heat treatment. The heat treatment temperature can be determined in consideration of the allowable temperature limit of the base substrate 110. In the case of using a glass substrate as the base substrate 110, for example, the heat temperature is preferably set to be higher than or equal to 400° C. and lower than or equal to 650° C. However, if heat treatment is performed in a short period of time, the heat temperature may be higher than or equal to 400° C. and lower than or equal to 700° C. Note that in this embodiment, heat treatment is performed at 600° C. for 2 hours.

By performing the above-described heat treatment, the volume of microvoids formed in the embrittlement region 102 is changed, and a crack is generated in the embrittlement region 102. Accordingly, the single crystal semiconductor substrate 100 is cleaved along the embrittlement region 102. Since the insulating layer 111 is bonded to the base substrate 110, the single crystal semiconductor layer 112 separated from the single crystal semiconductor substrate 100 is fixed over the base substrate 100. In addition, since the bonding interface between the base substrate 110 and the insulating layer 111 is heated by this heat treatment, a covalent bond is formed at the bonding interface, so that the bonding force between the base substrate 110 and the insulating layer 111 is further improved.

Then, laser partial melting treatment is performed in order to, for example, reduce defects in the single crystal semiconductor layer 112. In this embodiment, the single crystal semiconductor layer 112 is irradiated with a laser beam 113 (see FIG. 1E).

The crystallinity of the single crystal semiconductor layer 112 disposed in close contact with the supporting substrate 110 is impaired by formation of the embrittlement region 102, cleavage along the embrittlement region 102, and the like. That is, the single crystal semiconductor layer 112 is provided with crystal defects such as dislocation or the like which does not exist in the single crystal semiconductor substrate 100 before processing or with crystal micro defects such as dangling bonds or the like. In addition, the surface of the single crystal semiconductor layer 112 is a separation plane from the single crystal semiconductor substrate 100 and thus planarity of the surface of the single crystal semiconductor layer 112 is impaired. In order to recover the crystallinity of the single crystal semiconductor layer 112, the single crystal semiconductor layer 112 is melted and re-single-crystallized by being irradiated with the laser beam 113. In addition, in order to planarize the surfaces of the single crystal semiconductor layer 112, the single crystal semiconductor layer 112 is melted by being irradiated with the laser beam 113. Note that "re-single-crystallization of a single crystal semiconductor layer" means that a semiconductor layer having a single crystal structure obtains a single crystal structure again through a state which is different from the single crystal structure (e.g., a liquid phase state). In addition, it can also be said that "re-single-crystallization of a single crystal semiconductor layer" means that a single crystal semiconductor layer having crystal defects as described above is recrystallized to form a single crystal semiconductor layer.

When irradiated with the laser beam 113, the single crystal semiconductor layer 112 absorbs the laser beam 113, and the temperature of a portion irradiated with the laser beam 113 is increased. When the temperature of this portion becomes equal to or higher than the melting point of the single crystal semiconductor substrate, the portion is melted. After the irradiation with the laser beam 113 is stopped, the temperature of the melted portion of the single crystal semiconductor layer 112 decreases, and the melted portion is solidified and re-single-crystallized. By scanning with the laser beam 113, the entire surface of the single crystal semiconductor layer 112 is irradiated with the laser beam 113. Alternatively, only a region of the single crystal semiconductor layer 112 that needs re-single-crystallization may be selectively irradiated with the laser beam 113.

A single crystal semiconductor layer 120 obtained through the laser irradiation treatment has higher crystallinity than the single crystal semiconductor layer 112. In addition, planarity can be improved by the laser irradiation treatment. This is because microdefects, such as a dangling bond in the single crystal semiconductor layer 112, can be repaired by melting the single crystal semiconductor layer 112. Note that the crystallinity of the single crystal semiconductor layer 120 can be evaluated by measurement of an electron backscatter diffraction pattern (electron backscatter pattern (EBSP)), measurement of an X-ray diffraction pattern, observation using an optical microscope and an electron microscope, measurement of a Raman spectroscopic spectrum, or the like. Further, the planarity of the surface of the single crystal semiconductor layer 120 can be evaluated by observation using an atomic force microscope, for example.

By irradiation with the laser beam 113, a region irradiated with the laser beam 113 in the single crystal semiconductor layer 112 is partially melted. Note that, to partially melt the single crystal semiconductor layer 112 means melting the single crystal semiconductor layer 112 so that the depth of a melted portion is shallower than that of the interface with the first insulating layer (the thickness of the single crystal semiconductor layer 112). In other words, a partially melted state of the single crystal semiconductor layer 112 means a state in which the upper portion is melted into a liquid phase and the lower portion is not melted and remains as a solid-phase single crystal semiconductor.

When the single crystal semiconductor layer 112 is partially melted by being irradiated with the laser beam 113, planarization advances due to surface tension of a semiconductor that is changed into a liquid phase. At the same time, cooling of the single crystal semiconductor layer 112 advances due to thermal diffusion to the supporting substrate 110. In the single crystal semiconductor layer 112, temperature gradient is generated in the depth direction. The solid-liquid interface moves from the supporting substrate 110 side to the surface of the single crystal semiconductor layer 112, and re-single-crystallization occurs. A so-called longitudinal growth occurs. It is thought that this re-single-crystallization advances using as a seed a lower portion which is not melted.

The lower solid-phase portion is single crystal and has uniform crystal orientation. Thus, no crystal grain boundary is formed in the lower solid-phase portion and the single crystal semiconductor layer 120 after the laser partial melting treatment can be a single crystal semiconductor layer without any crystal grain boundary. The upper melted portion is re-single-crystallized by being solidified, and a single crystal semiconductor which has the same crystal orientation as the single crystal semiconductor in the lower portion which remains in a solid phase is formed. Therefore, in the case where a single crystal silicon wafer whose main surface is oriented along the (100) plane is used as the single crystal semiconductor substrate 100, a main surface of the single crystal semiconductor layer 112 is oriented along the (100) plane, and a main surface of the single crystal semiconductor layer 120 which is re-single-crystallized by laser partial melting treatment is oriented along the (100) plane.

Moreover, by performing the laser partial melting treatment on the single crystal semiconductor layer 112, the single crystal semiconductor layer 120 having a planar surface can be formed. This is because a melted portion of the single crystal semiconductor layer 112 is liquid and thus surface area of the single semiconductor layer 112 is changed to minimize its shape by the action of surface tension. That is, a liquid portion is transformed so as to have no recessed and projected portions, and this liquid portion is then solidified to be re-single-crystallized. Accordingly, the single crystal semiconductor layer 120 having a planarized surface can be formed.

By planarization of the surface of the single crystal semiconductor layer 112, the thickness of a gate insulating film which is formed over the single crystal semiconductor layer 120 can be made small to, approximately, 5 nm to 50 nm. Accordingly, a transistor having high ON current can be formed while gate voltage is kept low.

Examples of a pulsed laser that is used for the laser partial melting treatment step include excimer lasers such as a XeCl laser and a KrF laser and gas lasers such as an Ar laser and a Kr laser. Other examples that can be used are solid-state lasers such as a YAG laser, a $YVO_4$ laser, a YLF laser, a $YAlO_3$ laser, a $GdVO_4$ laser, a KGW laser, a KYW laser, and a $Y_2O_3$ laser. As the laser beam 113, a fundamental wave, a harmonic (such as a second harmonic, a third harmonic, or a fourth harmonic) of any of these lasers can be used. Some of these solid-state lasers can be either a continuous wave laser or a quasi-continuous wave laser even when using the same laser medium.

As a laser that emits the laser beam 113, a laser whose emission wavelength is in the range from the ultraviolet region to the visible light region is selected. The wavelength of the laser beam 113 is set to a wavelength that is absorbed by the single crystal semiconductor layer 112. The wavelength can be determined in consideration of the skin depth of the laser beam and the like. For example, the wavelength can be in the range of 250 nm to 700 nm inclusive.

Further, the energy of the laser beam 113 can be determined in consideration of the wavelength of the laser beam 113, the skin depth of the laser beam 113, the thickness of the single crystal semiconductor layer 112, or the like. When a pulsed laser is used, the energy density of the laser beam 113 can be set, for example, in the range of 300 $mJ/cm^2$ to 700 $mJ/cm^2$ inclusive.

Irradiation with the laser beam 113 may be performed either in an air atmosphere without any control or in an inert gas atmosphere. It is confirmed that each of the air atmosphere and the inert gas atmosphere is effective for crystallinity recovery and planarization of the single crystal semiconductor layer 112. It is also confirmed that the inert gas atmosphere is more preferable than the air atmosphere. An inert gas atmosphere such as nitrogen is more effective than an air atmosphere in improving planarity of the single crystal semiconductor layer 112. In addition, deformation such as a crack is less likely to be generated in an inert gas atmosphere than in an air atmosphere. The energy of the laser beam 113 to reduce crystal defects and to achieve planarization can be selected from a wider range in an inert gas atmosphere than in an air atmosphere.

After the above-described irradiation with the laser beam 113, a step of reducing the thickness of the single crystal semiconductor layer 112 may be performed. In order to thin the single crystal semiconductor layer 112, one of dry etching and wet etching or a combination of both of the etchings may be employed (etch back treatment). For example, in the case where the single crystal semiconductor layer 112 is a layer formed using a silicon material, the single crystal semiconductor layer 112 can be thinned by dry etching treatment using a $Cl_2$ gas or a mixed gas containing $CF_4$ and $O_2$ for a process gas.

Note that, although an example in which the etching treatment is performed after planarization by laser beam irradiation has been described in this embodiment, the present invention is not interpreted as being limited thereto. For example, etching treatment may be performed before laser beam irradiation. Alternatively, the etching treatment may be performed both before and after irradiation with the laser beam. Further alternatively, laser beam irradiation and the etching treatment may be alternately repeated.

In the foregoing manner, a semiconductor substrate including the single crystal semiconductor layer 120 (the single crystal silicon semiconductor layer) having improved surface planarity and reduced defects can be manufactured (see FIG. 1F). However, a micro defect at an interface between the single crystal semiconductor layer 120 and the insulating layer 111 cannot be removed by such partial melting; accordingly, a hole trap at the defect remains. FIG. 2A is an enlarged view of the cross section of FIG. 1F. A hole trap as described in Embodiment 1 remains in the vicinity of an interface region 701, which causes the S value of the p-channel transistor to increase.

In order to control the threshold voltage of the transistor, a p-type impurity element such as boron, aluminum, or gallium or an n-type impurity element such as phosphorus or arsenic is added to the single crystal semiconductor layer 120. The region to which an impurity element is added and the kind of impurity element to be added can be changed as appropriate. For example, a p-type impurity element can be added to a region where an n-channel transistor is formed, and an n-type impurity element can be added to a region where a p-channel transistor is formed. It is preferable that the addition of the above-described impurity element be performed so that the concentration of the impurity element in the single crystal semiconductor layer is approximately higher than or equal to $1 \times 10^{15}$ atoms/cm$^3$ and lower than or equal to $1 \times 10^{17}$ atoms/cm$^3$. Then, the single crystal semiconductor layer 120 is separated into island shapes to form a semiconductor layer 702 and a semiconductor layer 704 (see FIG. 2B). Note that the above-described impurity addition may be performed after formation of the semiconductor layer 702 and the semiconductor layer 704.

Here, prior to addition of a p-type impurity element to a region where an n-channel transistor is formed, a photomask is formed to expose the region to which the impurity element is added. At this time, a single crystal semiconductor layer, that is, the semiconductor layer 702, is thinned by dry etching. For this etching as well, etching treatment (etch-back treatment) of either dry etching or wet etching or a combination thereof may be employed. In addition, a mask, which is used in adding the n-type impurity element to the semiconductor layer 702, can be used in performing etching treatment on the semiconductor layer 702. By this treatment, the thickness of the semiconductor layer 702 of the n-channel transistor is made smaller than that of the semiconductor layer 704 of the p-channel transistor.

Figure 2C:
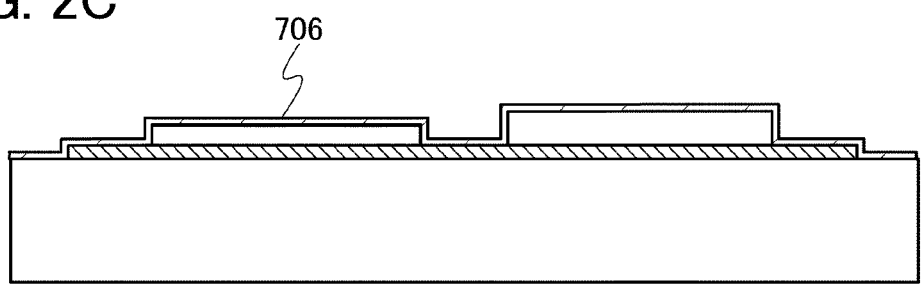

Next, a gate insulating layer 706 is formed so as to cover the semiconductor layer 702 and the semiconductor layer 704 (see FIG. 2C). Here, a silicon oxide film is formed in a single layer by a plasma CVD method. Alternatively, the gate insulating layer 706 may be formed to have a single-layer structure or a stacked structure using a film including silicon oxynitride, silicon nitride oxide, silicon nitride, hafnium oxide, aluminum oxide, tantalum oxide, or the like.

As a manufacturing method other than a plasma CVD method, a sputtering method or an oxidation or nitridation method using high density plasma treatment can be given. High-density plasma treatment is performed by using, for example, a mixed gas of a rare gas such as helium, argon, krypton, or xenon; and a gas such as oxygen, nitrous oxide, ammonia, nitrogen, or hydrogen. In this case, by exciting plasma by introduction of microwaves, plasma with a low electron temperature and high density can be generated. A surface of a semiconductor layer is oxidized or nitrided with oxygen radicals (OH radicals may be included) or nitrogen radicals (NH radicals may be included) which are generated by such a high-density plasma, whereby an insulating layer is formed to have a thickness of 1 nm to 20 nm inclusive, preferably 2 nm to 10 nm inclusive so as to be in contact with the semiconductor layer.

Since oxidation or nitridation of the semiconductor layers by the high-density plasma treatment is a solid-phase reaction, the interface state density between the gate insulating layer 706 and each of the semiconductor layers 702 and 704 can be drastically decreased. Further, by directly oxidizing or nitriding the semiconductor layers by high-density plasma treatment, variation in thickness of the insulating layer to be formed can be suppressed. Since the semiconductor layers have crystallinity, even when surfaces of the semiconductor layers are oxidized by a solid-phase reaction by using the high-density plasma treatment, nonuniform oxidation in a crystal grain boundary can be suppressed; thus, a gate insulating layer with favorable uniformity and a low interface state density can be formed. A transistor including the insulating layer formed in this manner by high-density plasma treatment in part of the gate insulating layer of the transistor or as the whole gate insulating layer of the transistor can have little characteristic variation.

A more specific example of a manufacturing method of an insulating layer by plasma treatment will be described. The surfaces of the semiconductor layers 702 and 704 are oxidized or nitrided in such a manner that nitrous oxide (N$_2$O) is diluted to be greater than or equal to 1 time and less than or equal to 3 times (the flow ratio) with argon (Ar) and a microwave power (2.45 GHz) of greater than or equal to 3 kW and less than or equal to 5 kW is applied under a pressure of greater than or equal to 10 Pa and less than or equal to 30 Pa. By this treatment, a lower layer of the gate insulating layer 706 is formed with a thickness greater than or equal to 1 nm and less than or equal to 10 nm (preferably greater than or equal to 2 nm and less than or equal to 6 nm). Further, a silicon oxynitride film is formed as an upper layer of the gate insulating layer 706 by a vapor-phase growth method in such a manner that nitrous oxide (N$_2$O) and silane (SiH$_4$) are introduced and a microwave power (2.45 GHz) of greater than or equal to 3 kW and less than or equal to 5 kW is applied under a pressure of greater than or equal to 10 Pa and less than or equal to 30 Pa. The gate insulating layer 706 is formed by combining solid phase reaction and reaction by a vapor-phase growth method in the above-described manner, whereby the gate insulating layer 706 with a low interface state density and excellent withstand voltage can be formed. Note that the gate insulating layer 706 in this case has a two-layer structure.

Alternatively, the gate insulating layer 706 may be formed by thermally oxidizing the semiconductor layers 702 and 704. In the case of forming the gate insulating layer 706 by such thermal oxidation, a base substrate with a comparatively high heat resistance is preferably used.

Further alternatively, after the gate insulating layer 706 containing hydrogen is formed, hydrogen contained in the gate insulating layer 706 may be dispersed in the semiconductor layers 702 and 704 by performing heat treatment at a temperature of higher than or equal to 350° C. and lower than or equal to 450° C. In this case, the gate insulating layer 706 may be formed by depositing silicon nitride or silicon nitride oxide by a plasma CVD method. Further, in this case, a process temperature may be set to lower than or equal to 350° C. By supplying hydrogen to the semiconductor layers 702 and 704 in the above-described manner, defects in the semiconductor layer 702, in the semiconductor layer 704, at an interface between the gate insulating layer 706 and the semiconductor layer 702, and at an interface between the gate insulating layer 706 and the semiconductor layer 704 can be effectively reduced.

Figure 2D:
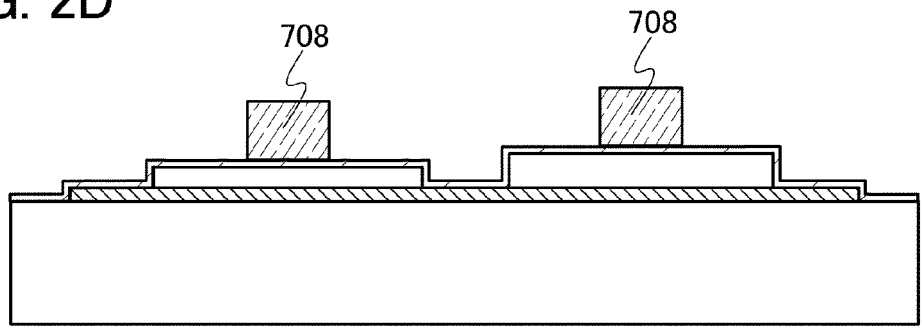

Next, a conductive layer is formed over the gate insulating layer 706, and then the conductive layer is processed (patterned) into a predetermined shape, whereby electrodes 708 are formed over the semiconductor layers 702 and 704 (see FIG. 2D). The conductive layer can be formed by a CVD method, a sputtering method, or the like. The conductive layer can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as its main component or a compound containing the above-described metal can also be used. Further alternatively, a semiconductor material such as polycrystalline silicon, in which a semiconductor film is doped with an impurity element imparting a conductivity type, may be used.

Although the electrodes 708 are formed as a single-layer conductive layer in this embodiment, the semiconductor device of the present invention is not limited to the structure. The electrodes 708 may each be formed of plural conductive layers which are stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked structure of a titanium film, an aluminum film, and a titanium film; or the like may be used.

Note that a mask used for forming the electrodes 708 may be formed using a material such as silicon oxide, silicon nitride oxide, or the like. In this case, a step of forming a mask by patterning a silicon oxide film, a silicon nitride oxide film, or the like is additionally needed; however, the amount of the reduced film thickness of the mask in etching is smaller than that of the resist material; thus, the electrodes 708 with a precise shape can be formed. Alternatively, the electrodes 708 may be selectively formed by a droplet discharge method without using a mask. Here, "a droplet discharge method" refers to a method in which droplets containing a predetermined composition are discharged or ejected to form a predetermined pattern, and includes an ink-jet method and the like in its category.

Alternatively, the electrodes 708 can be formed by etching the conductive layer to have a desired tapered shape by an inductively coupled plasma (ICP) etching method with appropriate adjustment of the etching conditions (e.g., the amount of electric power applied to a coiled electrode layer, the amount of electric power applied to an electrode layer on the substrate side, the electrode temperature on the substrate side, and the like). The tapered shape can also be adjusted by the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 3A:
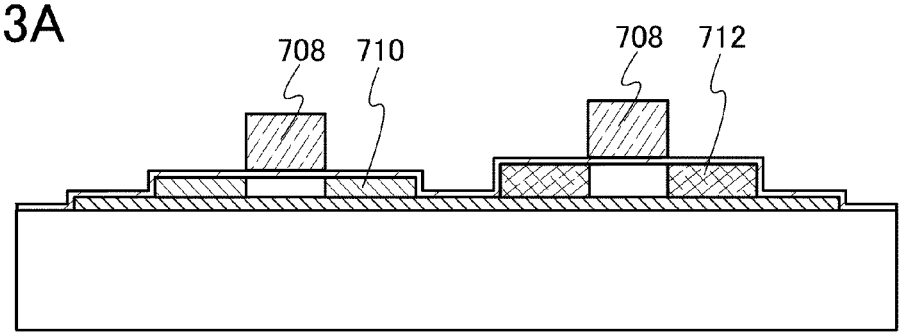
FIGS. 3A to 3D illustrate a manufacturing process of a semiconductor device.

Next, an impurity element imparting one conductivity type is added to the semiconductor layers 702 and 704 using the electrodes 708 as masks (see FIG. 3A). In this embodiment, an impurity element imparting n-type conductivity (e.g., phosphorus or arsenic) is added to the semiconductor layer 702, and an impurity element imparting p-type conductivity (e.g., boron) is added to the semiconductor layer 704. Note that when the impurity element imparting n-type conductivity is added to the semiconductor layer 702, the semiconductor layer 704 to which the p-type impurity element is added is covered with a mask or the like so that the impurity element imparting n-type conductivity is added selectively. Alternatively, the semiconductor layer 704 may be covered with the mask which is used in the etching treatment on the semiconductor layer 702. When the impurity element imparting p-type conductivity is added to the semiconductor layer 704, the semiconductor layer 702 to which the n-type impurity element is added is covered with a mask or the like so that the impurity element imparting p-type conductivity is added selectively. Alternatively, after the impurity element imparting one of p-type and n-type conductivities is added to the semiconductor layers 702 and 704, an impurity element imparting the other conductivity type may be added only to one of the semiconductor layers at a higher concentration. By the above-described impurity addition, impurity regions 710 are formed in the semiconductor layer 702 and impurity regions 712 are formed in the semiconductor layer 704.

Figure 3B:
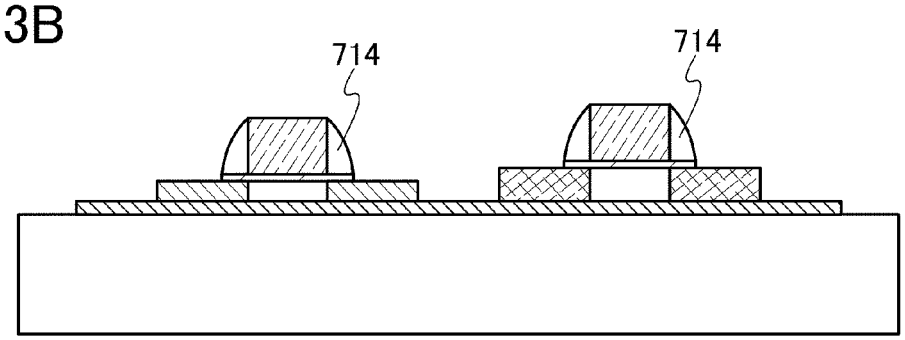

Next, sidewalls 714 are formed on side surfaces of the gate electrodes 708 (see FIG. 3B). The sidewalls 714 can be formed by, for example, newly forming an insulating layer so as to cover the gate insulating layer 706 and the electrodes 708 and by partially etching the newly-formed insulating layer by anisotropic etching mainly in a perpendicular direction. Note that the gate insulating layer 706 may also be etched partially by the anisotropic etching. An insulating layer for forming the sidewalls 714 may be formed by a plasma CVD method, a sputtering method, or the like, to have a single-layer structure or a stacked structure including any of films containing silicon, silicon oxide, silicon nitride, silicon oxynitride, silicon nitride oxide, an organic material, or the like. In this embodiment, a 100-nm-thick silicon oxide film is formed by a plasma CVD method. In addition, as an etching gas, a mixed gas of $CHF_3$ and helium can be used. Note that a process for forming the sidewalls 714 is not limited thereto.

Figure 3C:
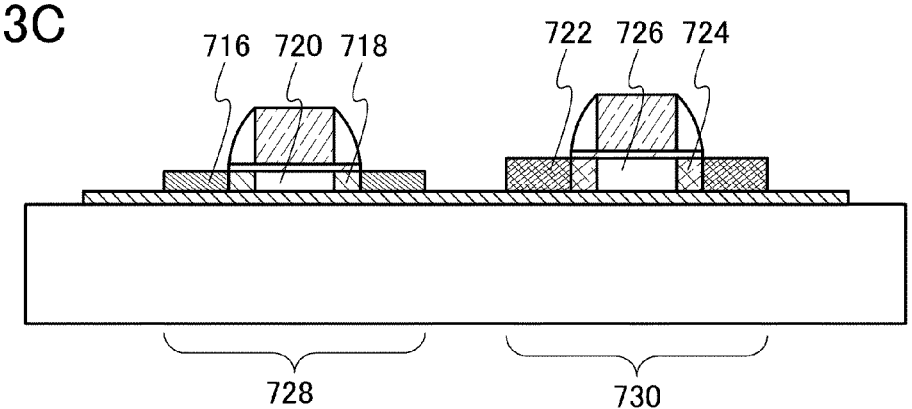

Next, an impurity element imparting one conductivity type is added to the semiconductor layers 702 and 704 using the gate insulating layer 706, the electrodes 708, and the sidewalls 714 as masks (see FIG. 3C). Note that the impurity elements imparting the same conductivity types as the impurity elements which have been added to the semiconductor layer 702 and the semiconductor layer 704 in the previous step are added to the semiconductor layer 702 and the semiconductor layer 704 at higher concentrations than those in the previous step. Note that when the impurity element imparting n-type conductivity is added to the semiconductor layer 702, the semiconductor layer 704 to which the p-type impurity element is added is covered with a mask or the like so that the impurity element imparting n-type conductivity is added selectively. When the impurity element imparting p-type conductivity is added to the semiconductor layer 704, the semiconductor layer 702 to which the n-type impurity element is added is covered with a mask or the like so that the impurity element imparting p-type conductivity is added selectively.

By the above-described addition of the impurity element, a pair of high-concentration impurity regions 716, a pair of low-concentration impurity regions 718, and a channel formation region 720 are formed in the semiconductor layer 702. In addition, by the above-described addition of the impurity element, a pair of high-concentration impurity regions 722, a pair of low-concentration impurity regions 724, and a channel formation region 726 are formed in the semiconductor layer 704. The high-concentration impurity regions 716 and the high-concentration impurity regions 722 each serve as a source or a drain, and the low-concentration impurity regions 718 and the low-concentration impurity regions 724 each serve as an LDD (lightly doped drain) region.

Note that the sidewalls 714 formed over the semiconductor layer 702 and the sidewalls 714 formed over the semiconductor layer 704 may be formed so as to have the same width in a direction where carriers move (that is, a direction parallel to a channel length), or may be formed so as to have different widths. The width of each sidewall 714 over the semiconductor layer 704 which constitutes part of a p-channel transistor is preferably larger than the width of each sidewall 714 over the semiconductor layer 702 which constitutes part of an n-channel transistor. This is because boron which is added for forming a source and a drain in the p-channel transistor is likely to be diffused and a short channel effect tends to be induced. By making the width of each sidewall 714 in the p-channel transistor larger than that of each sidewall 714 in the n-channel transistor, boron can be added to the source and the drain in the p-channel transistor at high concentration, and thus the resistance of the source and the drain can be reduced.

In order to further reduce the resistance of the source and the drain, a silicide layer may be formed by silicification of parts of the semiconductor layer 702 and the semiconductor layer 704. The silicide is formed by placing a metal in contact with the semiconductor layers and causing a reaction between the metal and silicon in the semiconductor layers by heat treatment (e.g., a GRTA method, an LRTA method, or the like). The silicide layer may be formed using cobalt silicide or nickel silicide. In the case where the semiconductor layers 702 and 704 are thin, silicide reaction may proceed to bottoms of the semiconductor layers 702 and 704. As a metal material used for the silicification, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, the silicide layer can also be formed by laser irradiation or the like.

Through the aforementioned processes, an n-channel transistor 728 and a p-channel transistor 730 are formed. Note that although conductive layers each serving as a source electrode or a drain electrode are not formed in the stage shown in FIG. 3C, a structure including these conductive layers each serving as a source electrode or a drain electrode may also be referred to as a transistor.

Figure 3D:
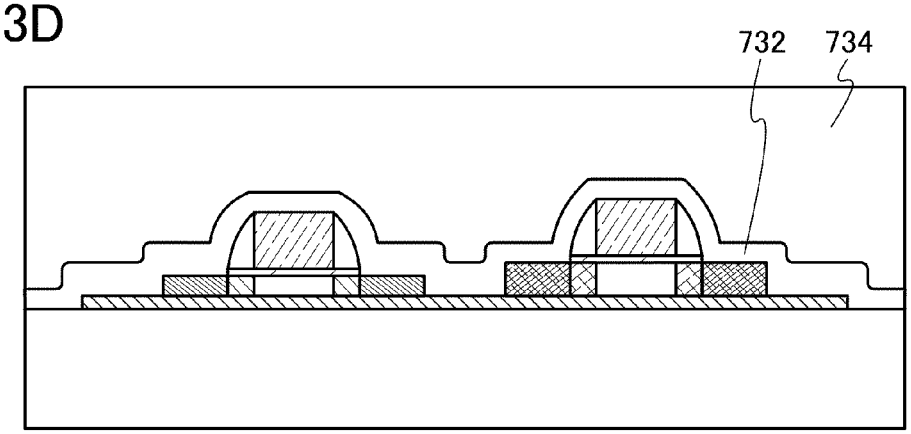

Next, an insulating layer 732 is formed to cover the n-channel transistor 728 and the p-channel transistor 730 (see FIG. 3D). The insulating layer 732 is not always necessary; however, the formation of the insulating layer 732 can prevent impurities such as an alkali metal and an alkaline-earth metal from penetrating the n-channel transistor 728 and the p-channel transistor 730. In specific, the insulating layer 732 is preferably formed using a material such as silicon oxide, silicon nitride, silicon oxynitride, silicon nitride oxide, aluminum nitride, aluminum oxide, or the like. In this embodiment, a silicon nitride oxide film with a thickness of approximately 600 nm is used as the insulating layer 732. In this case, the above-described hydrogenation process may be performed after the silicon nitride oxide film is formed. Note that, although the insulating layer 732 has a single-layer structure in this embodiment, it is obvious that the insulating layer 732 can have a stacked structure. For example, in the case of a two-layer structure, the insulating layer 732 may have a stacked structure of a silicon oxynitride film and a silicon nitride oxide film.

Next, an insulating layer 734 is formed over the insulating layer 732 so as to cover the n-channel transistor 728 and the p-channel transistor 730. The insulating layer 734 is preferably formed using an organic material having heat resistance, such as polyimide, acrylic, benzocyclobutene, polyamide, or epoxy. As an alternative to the organic materials listed above, a low-dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like can be used. Here, the siloxane-based resin corresponds to a resin including a Si—O—Si bond which is formed using a siloxane-based material as a starting material. The siloxane-based resin may have one of fluorine, an alkyl group, and aromatic hydrocarbon besides hydrogen as a substituent. The insulating layer 734 may be formed by stacking plural insulating layers formed of any of the above-described materials.

In order to form the insulating layer 734, a CVD method, a sputtering method, an SOG method, spin coating, dipping, spray coating, a droplet discharge method (e.g., an inkjet method, screen printing, offset printing, or the like), a doctor knife, a roll coater, a curtain coater, a knife coater, or the like can be used as appropriate, in accordance with a material used.

Next, contact holes are formed in the insulating layer 732 and the insulating layer 734 so as to expose part of the semiconductor layer 702 and part of the semiconductor layer 704. Then, conductive layers 736 and conductive layers 738 are formed to be in contact with the semiconductor layer 702 and the semiconductor layer 704, respectively, through the contact holes (see FIG. 4A). Each of the conductive layers 736 and the conductive layers 738 serves as a source electrode or a drain electrode of the respective transistors. Note that in this embodiment, as an etching gas for forming the contact holes, a mixed gas of $CHF_3$ and He is employed; however, the etching gas is not limited thereto.

The conductive layers 736 and the conductive layers 738 can be formed by a CVD method, a sputtering method, or the like. Specifically, as the conductive layers 736 and the conductive layers 738, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Further, the conductive layers 736 and the conductive layers 738 may have a single-layer structure or a stacked structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the conductive layers 736 and the conductive layers 738. In particular, the aluminum silicon is preferable because a hillock can be prevented from generating due to resist baking at the time of patterning. Further, a material in which Cu is mixed into aluminum at approximately 0.5% may be used instead of silicon.

In the case where each of the conductive layers 736 and 738 is formed to have a stacked structure, a stacked structure of a barrier film, an aluminum silicon film, and a barrier film; a stacked structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming the conductive layers so as to sandwich an aluminum silicon film between the barrier films, generation of hillocks of aluminum or aluminum silicon can be further prevented. Moreover, by forming the barrier film using titanium that is a highly reducible element, even if a thin oxide film is formed over the semiconductor layers 702 and 704, the oxide film is reduced by the titanium contained in the barrier film, whereby preferable contact between the conductive layers 736 and the semiconductor layer 702 and between the conductive layers 738 and the semiconductor layer 704 can be obtained. Further, it is also possible to stack a plurality of barrier films. In that case, for example, each of the conductive layers 736 and the conductive layers 738 can be formed to have a five-layer structure of titanium, titanium nitride, aluminum silicon, titanium, and titanium nitride in order from the bottom or a stacked structure of more than five layers.

For the conductive layers 736 and the conductive layers 738, tungsten silicide formed by a chemical vapor deposition method using a $WF_6$ gas and a $SiH_4$ gas may be used. In addition, as the conductive layers 736 and the conductive layers 738, tungsten formed by hydrogen reduction of $WF_6$ can be used.

Note that the conductive layers 736 are connected to the high-concentration impurity regions 716 of the n-channel transistor 728. The conductive layers 738 are connected to the high-concentration impurity regions 722 of the p-channel transistor 730.

Figure 4A:
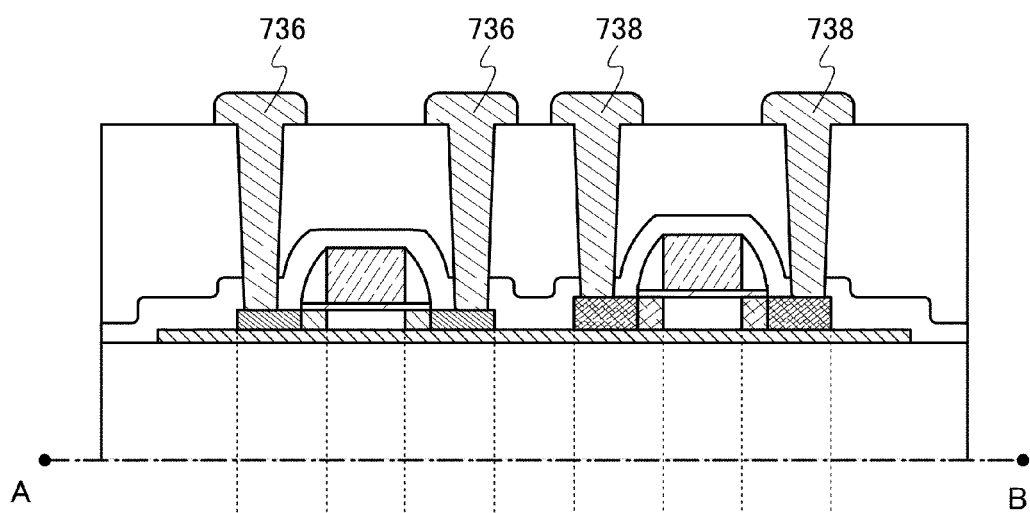
FIGS. 4A and 4B are a cross-sectional view and a plan view, respectively, of a semiconductor device.
Figure 4B:
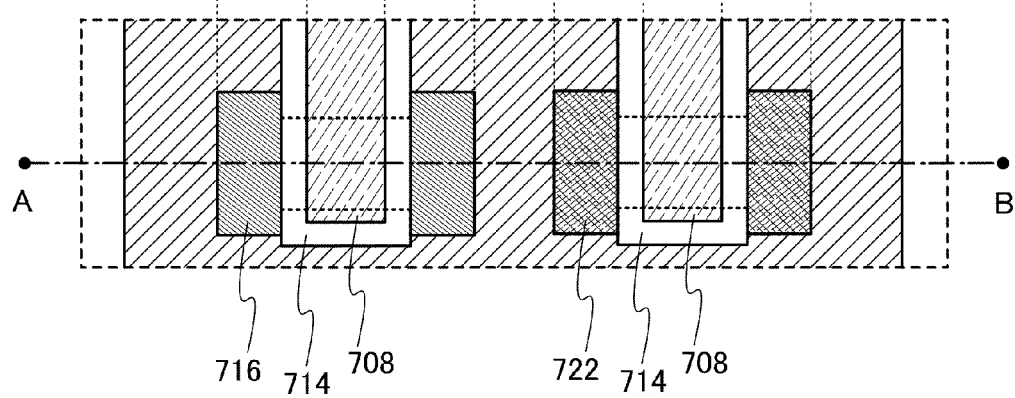

FIG. 4B is a plan view of the n-channel transistor 728 and the p-channel transistor 730 which are illustrated in FIG. 4A. Here, the cross section taken along a line A-B of FIG. 4B corresponds to FIG. 4A. Note that the conductive layers 736, the conductive layers 738, the insulating layer 732, the insulating layer 734, and the like are omitted in FIG. 4B for simplicity.

Note that although this embodiment describes the case where each of the n-channel transistor 728 and the p-channel transistor 730 includes one electrode 708 serving as a gate electrode as an example, the present invention is not limited to this structure. The transistor manufactured in the present invention may have a multi-gate structure, in which a plurality of electrodes serving as gate electrodes are included and electrically connected to one another.

In this embodiment, irradiation with a laser beam is performed to reduce defects and surface unevenness of a single crystal semiconductor layer. Further, by the present invention, the semiconductor layer thickness in each transistor can be optimized and the S value, which is a transistor characteristic of a semiconductor device, can be made small.

This embodiment can be implemented in combination with any of the other embodiments as appropriate.

Embodiment 2

In Embodiment 2, a preferable thickness of a single crystal semiconductor layer in a transistor which is a semiconductor device of the present invention as manufactured in Embodiment 1, will be described with reference to FIG. 5, FIG. 6, FIGS. 7A and 7B, FIGS. 8A and 8B, FIGS. 9A to 9C, and FIGS. 10A to 10F.

Figure 5:
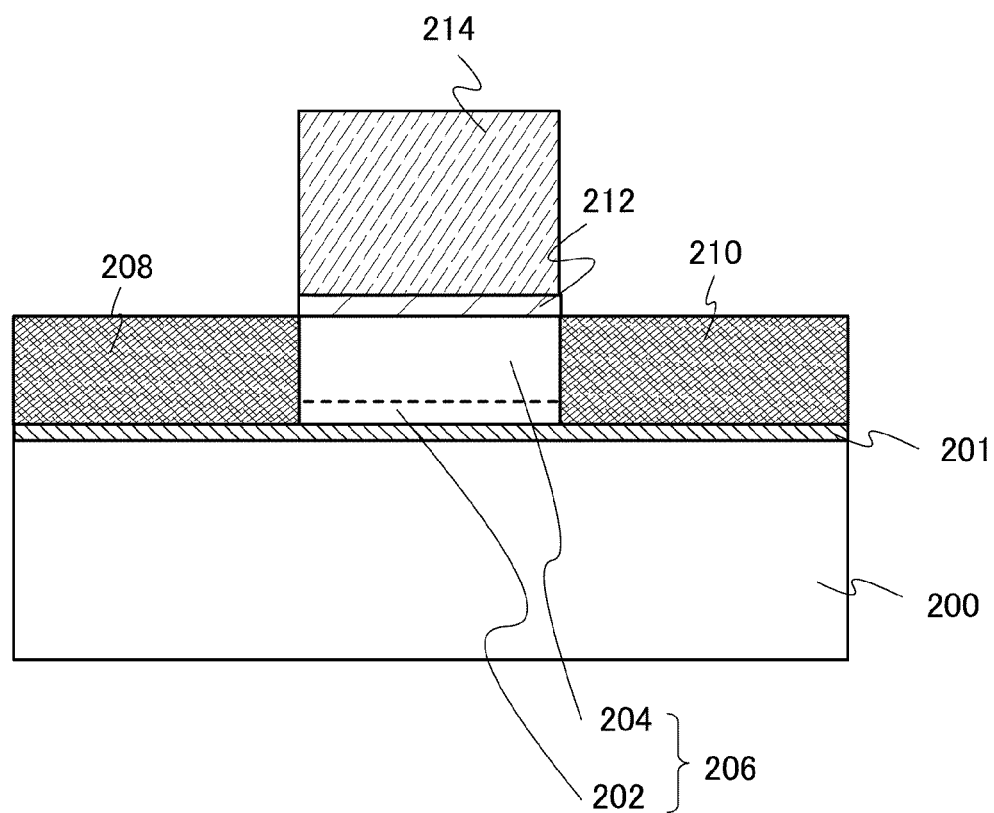
FIG. 5 is a cross-sectional view of a semiconductor device.

FIG. 5 illustrates a cross section of the transistor manufactured in Embodiment 1, which is used for evaluating transistor characteristics in this embodiment. Here, the transistor has a single-drain structure in which sidewalls 714, a pair of low-concentration impurity regions 718, and a pair of low-concentration impurity regions 724 are not formed.

The transistor of FIG. 5 includes a base insulating layer 201 formed over a base substrate 200, a single crystal semiconductor layer 206 formed over the base insulating layer 201, a gate insulating film 212 formed over the single crystal semiconductor layer 206, and a gate electrode 214 formed over the gate insulating film 212. In addition, a pair of high-concentration impurity regions, which are a high-concentration impurity region 208 and a high-concentration impurity region 210, are formed in the single crystal semiconductor layer 206 and serve as a source region and a drain region. In this embodiment, the area of the single crystal semiconductor layer 206 below the gate electrode 214 is classified into a first region 202 which is near the base substrate 200 and a second region 204 which is near the gate insulating film 212. Note that the single crystal semiconductor layer 206 is formed in a manner as described in Embodiment 1 such that the embrittlement region 102 is formed and separation is performed at the region. Conditions in manufacturing the transistor of FIG. 5 are described below.

Ion irradiation for forming the embrittlement region 102 in this embodiment was performed by an ion doping method using $H_3^+$ ions as a main ion. The accelerating voltage may be selected from the range of 10 kV to 200 kV. Here, the accelerating voltage was set at 40 kV. The dose, which is an irradiation amount of ions, may be selected from the range of $5 \times 10^{15}$ ions/cm$^2$ to $5 \times 10^{16}$ ions/cm$^2$, and here was set at $2 \times 10^{16}$ ions/cm$^2$.

The gate insulating film 212 was formed to have a stacked structure of a silicon nitride oxide film and a silicon oxynitride film. The silicon nitride oxide film is formed by a plasma CVD method using $SiH_4$, $N_2O$, $NH_3$, and $H_2$ as a source gas. The gas flow rate was $SiH_4/N_2O/NH_3/H_2$=10/18/100/400. The film formation temperature was 400° C., the RF frequency was 27.12 MHz, the RF power was 50 W, and the RF power density was 0.083 W/cm$^2$. The film thickness was 50 nm. The silicon oxynitride film is formed by a plasma CVD method using $SiH_4$ and $N_2O$ as a source gas. The gas flow rate was $SiH_4/N_2O$=4/800. The film formation temperature was 400° C., the RF frequency was 27.12 MHz, the RF power was 50 W, and the RF power density was 0.083 W/cm$^2$. The film thickness was 50 nm. Note that, in this embodiment, the silicon oxynitride film means a film that contains more oxygen than nitrogen and, when being measured using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the silicon nitride oxide film means a film that contains more nitrogen than oxygen and, when being measured using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

In laser partial melting treatment, a surface of the single crystal semiconductor layer is irradiated with an excimer laser beam or a second harmonic wave of a solid-state laser of a YAG laser. The wavelengths of an ArF excimer laser, a KrF excimer laser, a XeCl excimer laser, and a XeF excimer laser are 193 nm, 248 nm, 308 nm, and 353 nm, respectively. Here, a XeCl excimer laser having a wavelength of 308 nm was used. The surface of the single crystal semiconductor layer is scanned by pulse irradiation with an excimer beam which is made to have a linear beam shape. The number of times of irradiation in each portion is set to 3 to 30, and the energy density is set in the range of 300 mJ/cm$^2$ to 900 mJ/cm$^2$. Here, the energy density was set at 650 mJ/cm$^2$. Further, heat treatment was performed using a resistance heating furnace to reduce defects. The maximum temperature was set at 600° C., and the treatment time at the maximum temperature was 4 hours.

Next, dry etching was performed to make the single crystal semiconductor layer have a desired thickness. The dry etching is performed using a $Cl_2$ gas or a mixed gas of $CF_4$ and $O_2$. The thickness of the single crystal semiconductor layer after this etching was arranged to be 60 nm.

In channel doping, a predetermined amount of boron was added to an n-channel transistor region or an active layer region in an n-channel transistor by an ion implantation method or an ion doping method. The addition of boron was performed so that the peak concentration in the single crystal semiconductor layer was in the range of $5 \times 10^{16}$ atoms/cm$^3$ to $5 \times 10^{17}$ atoms/cm$^3$ and a desired threshold voltage of the transistor could be obtained.

The gate electrode 214 was formed in such a manner that tantalum nitride was formed to a thickness of 30 nm and tungsten was formed thereover to a thickness of 370 nm by sputtering.

Figure 6:
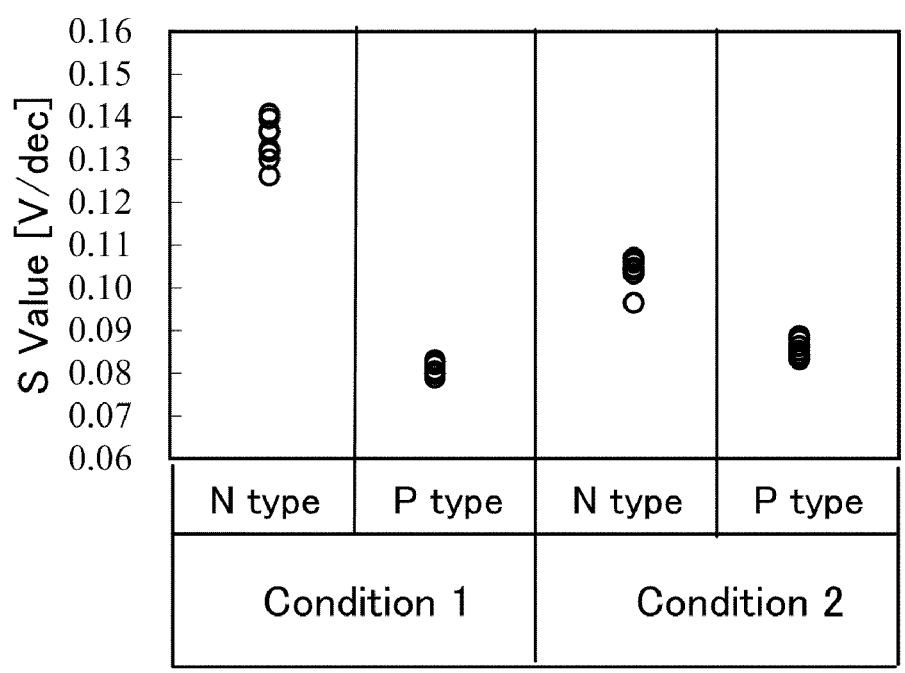
FIG. 6 shows electric characteristics of a semiconductor device.

Electric characteristics of the thus-formed transistor illustrated in FIG. 5, which was thus formed, were measured. The results were that when the single crystal semiconductor layer is thinner, the S value decreases in an n-channel transistor and increases in a p-channel transistor. FIG. 6 shows the S value of transistor characteristics when the thickness of the single crystal semiconductor film is about 100 nm (Condition 1) and when the thickness is about 60 nm (Condition 2). When the thickness of a single crystal semiconductor layer is smaller, the S value generally decreases; however, the results obtained were that the S value increases in a p-channel transistor. It is generally said that a hole trapping defect is generated by hydrogen doping, and the present inventors thought that this is because a hole trapping defect caused by hydrogen doping would exist in a region on the bonding plane side of the single crystal semiconductor layer. In other words, the present inventors thought in the following way. A single crystal semiconductor layer which is a single crystal silicon film formed by a hydrogen ion introduction separation method includes crystal defects, and a defect can be removed in a surface layer of the single crystal semiconductor layer by laser partial melting treatment; however, a defect cannot be removed in the single crystal semiconductor layer in a region near a base substrate, which is not melted by the laser partial melting treatment. Then, the crystal defect serves as a hole trap; accordingly, as thinning advances and a channel region is closer to the hole trap, the S value increases only in a p-channel transistor whose characteristics are likely to be affected by a hole trap.

Figure 7A:
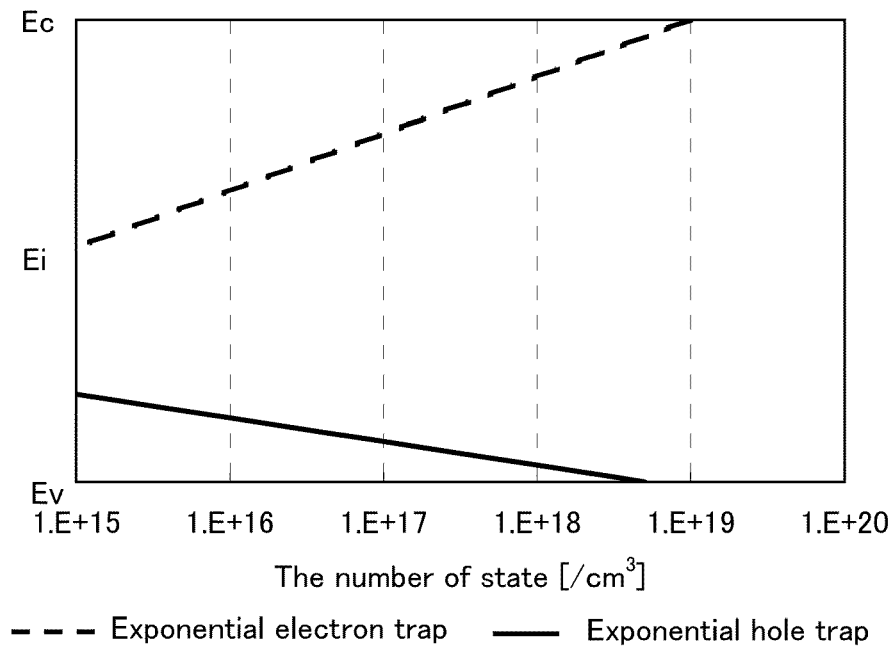
FIGS. 7A and 7B show simulation results of a semiconductor device.
Figure 7B:
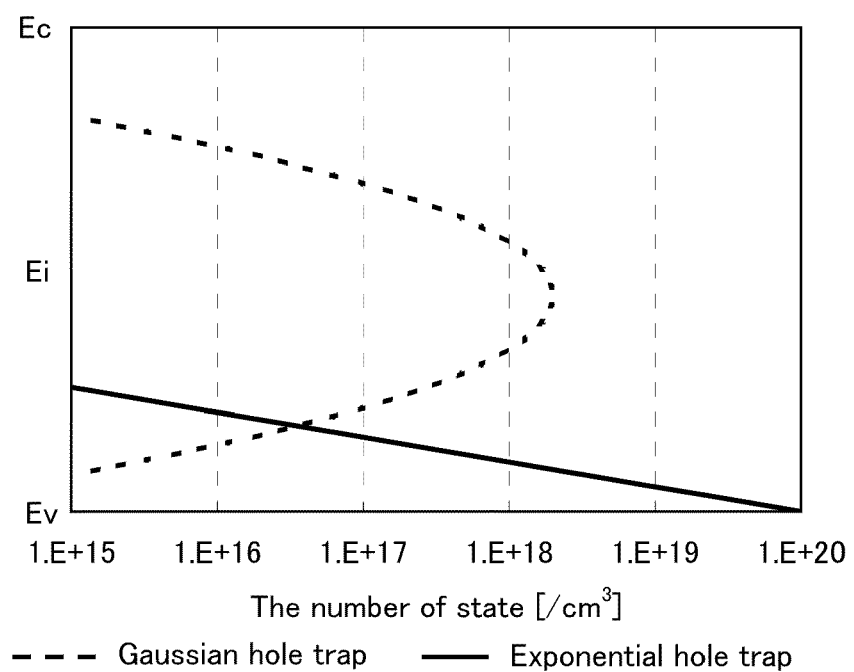

In order to investigate the cause of the increase in the S value in accordance with the thinning of the single crystal semiconductor layer of the p-channel transistor, calculation was performed on the assumption of, as shown in FIG. 7A, only a donor-like level serving as a hole trap in a region (the first region 202 in FIG. 5) in the single crystal semiconductor layer, which has a thickness of about 5 nm from the substrate side that is the bonding plane side, and on the assumption of, as shown in FIG. 7B, an exponential level (shallow level) serving as an electron trap or a hole trap in the other region (the second region 204 in FIG. 5). As a deep level, a Gaussian level was assumed. FIG. 7A shows the density of states in a band gap on the assumption of energy levels of an exponential electron trap and an exponential hole trap. FIG. 7B shows the density of states in a band gap on the assumption of energy levels of an exponential hole trap and a Gaussian hole trap. The structure used for calculation was a single-drain structure, where L/W=10/8 µm, the GI thickness was 20 nm, and doping of a portion below the gate electrode with an impurity element was not performed. Since a p-type substrate was actually used as the substrate, a p-type impurity element at a concentration of $1.0 \times 10^{15}/cm^3$ in an entire single crystal semiconductor layer was assumed. Parameters used in calculation were as follows. The thickness of a $SiO_2$ film which was used as a glass substrate was assumed to be about 1 µm, and the dielectric constant thereof was assumed to be 4.1. The dielectric constant of the gate insulating film was also assumed to be 4.1. The work function of the gate electrode was assumed to be 4.6 eV supposing that the gate electrode was tungsten. A large amount of an impurity element (boron) was added so that a region from an edge of the gate electrode to an edge of the device can have a conductivity type ($P^+$ region). This addition of the impurity element to form the $P^+$ region was performed using a function fitted to the impurity doping profile of our company. A device simulator "Atlas" made by Silvaco was used for the calculation.

A trap level formed by hydrogen doping is presented as the density of states. The density of states shows the number of states which can exist in an energy state. There is a probability of existence in the density of states, and the density made in consideration of the probability of existence is a carrier trap density. This carrier trap density largely affects the S value of transistor characteristics. In this simulation, the number of Gaussian hole traps and the number of exponential hole traps were assumed; however, the carrier trap density is little affected by the exponential trap. This is because, when Fermi-Dirac distribution function is considered, the number of states is large in a region where the probability of existence is low. That is, as the slope of this exponential trap is gentler, the number of hole traps increases. From these facts, shallow level traps do not affect the S value. Therefore, in this embodiment, the measured results were compared to the simulation results on the assumption of the Gaussian hole trap.

Figure 8A:
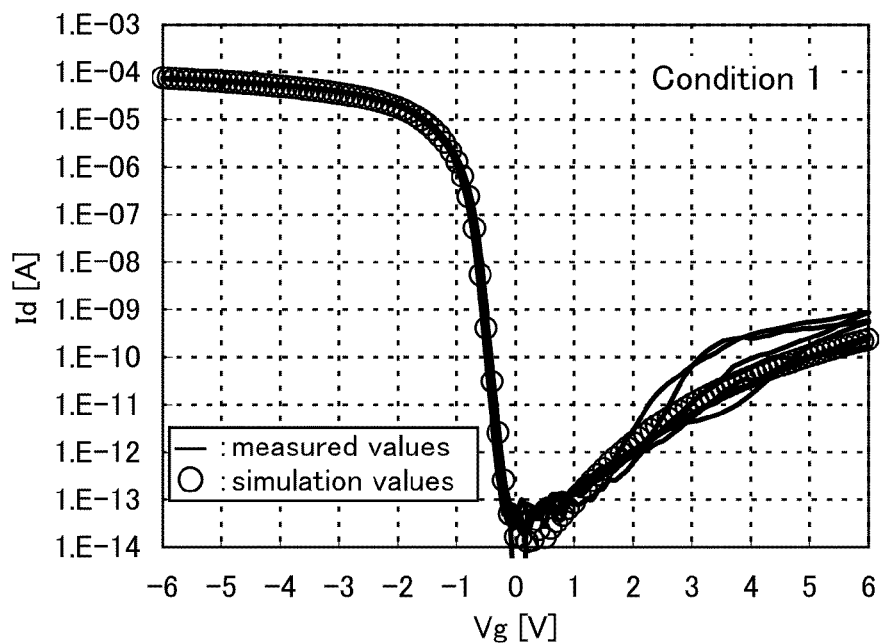
FIGS. 8A and 8B show electric characteristics and simulation results of semiconductor devices.
Figure 8B:
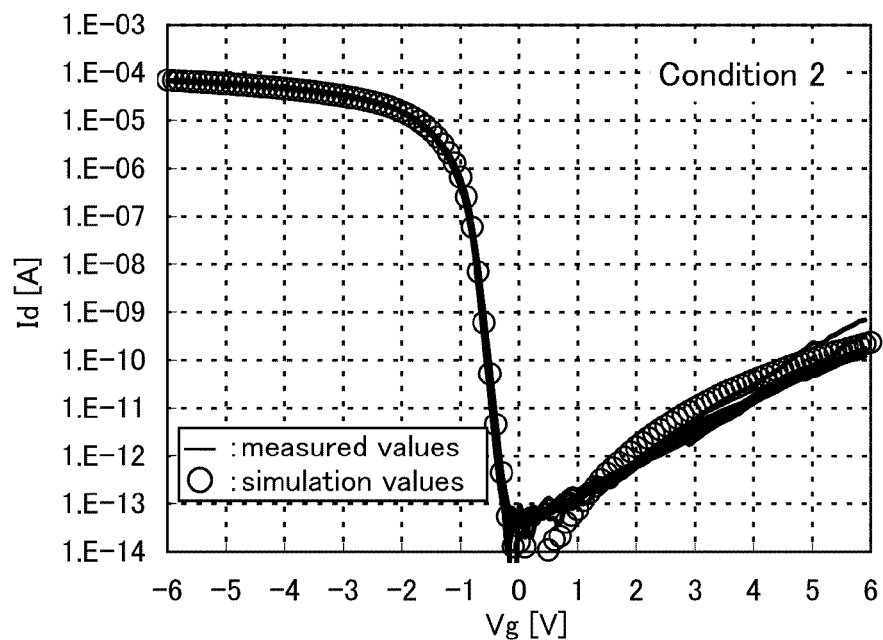
Figure 9A:
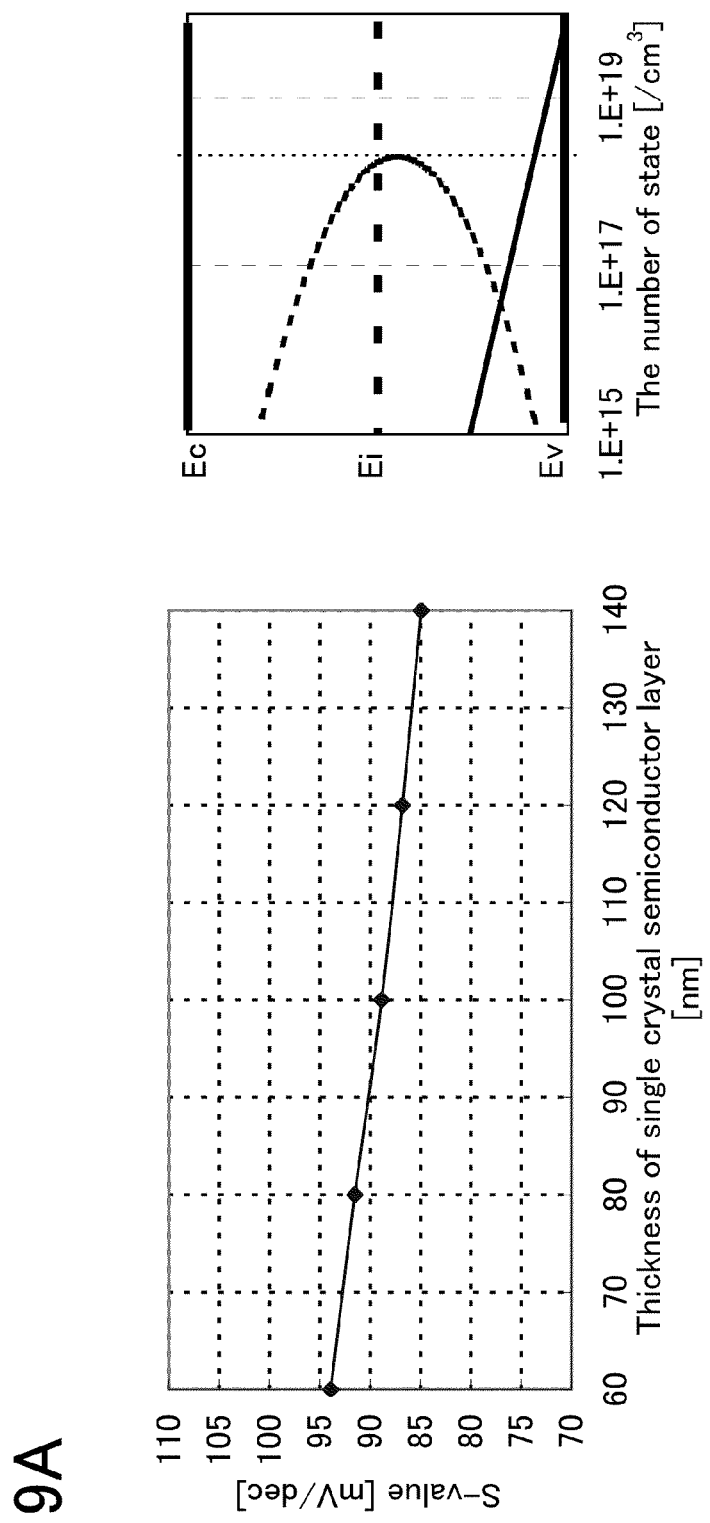
FIGS. 9A to 9C show simulation results of semiconductor devices.
Figure 9B:
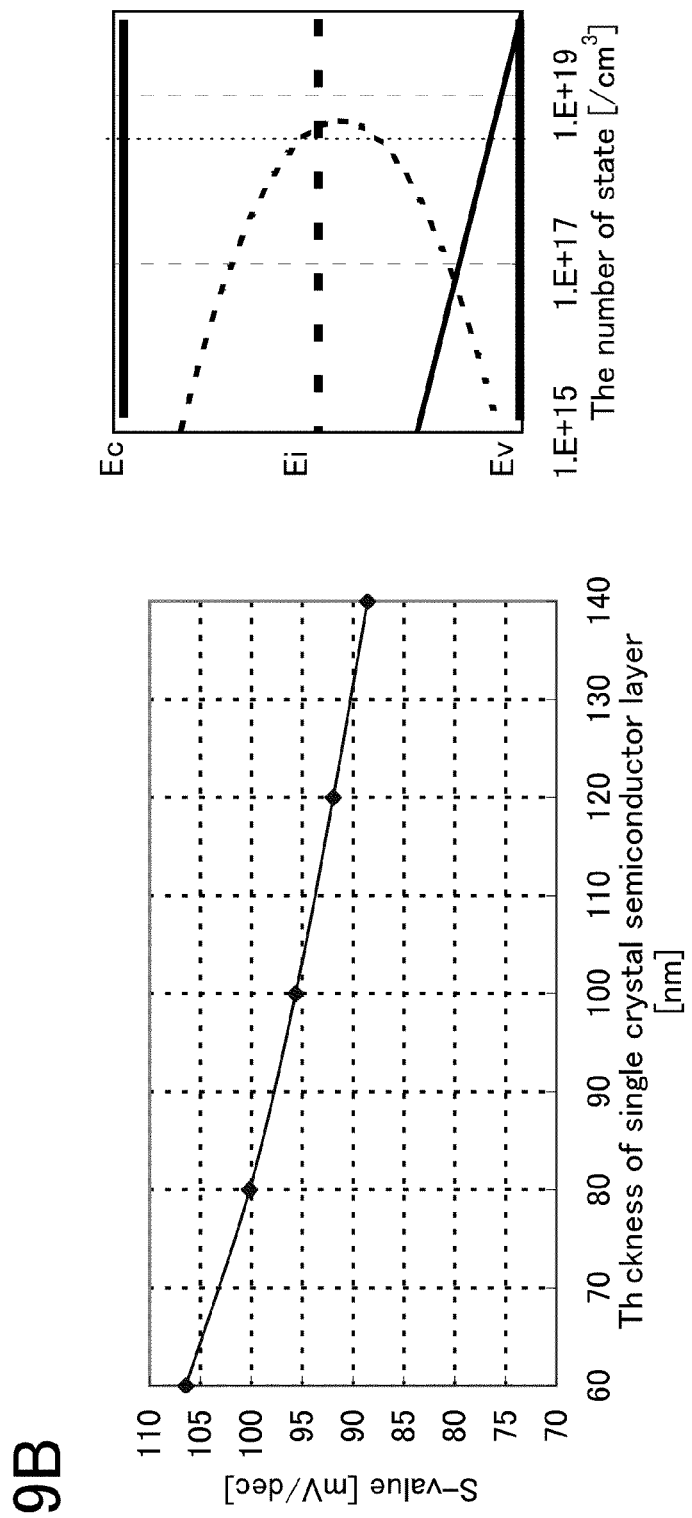
Figure 9C:
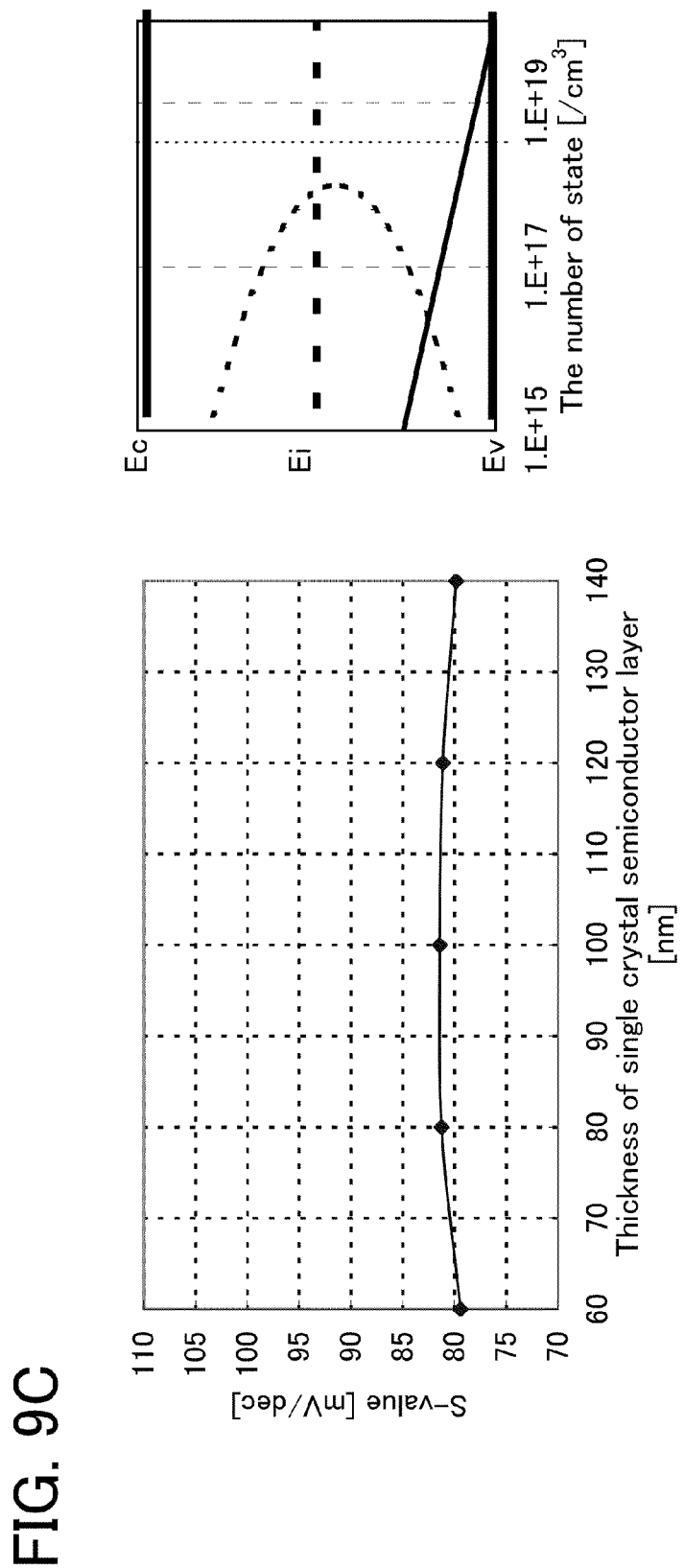

FIGS. 8A and 8B show calculation results fitted to measured values of the Id-Vg curve of a p-channel transistor when the thickness of a single crystal semiconductor layer is 100 nm (Condition 1) and 60 nm (Condition 2), respectively. The horizontal axis indicates Vg, and the vertical axis indicates Id. Since the measured values agreed with the simulation values according to the results of FIG. 8A and FIG. 8B, it was judged that they were sufficiently fitted to each other. Then, in such conditions, the S value with respect to the thickness of the single crystal semiconductor layer was calculated. The result was that as the thickness is smaller, the S value increases as shown in FIG. 9A. Further, since it was found by the calculation that the S value affects the deep-level trap, the relation between the thickness of the single crystal semiconductor layer and the S value was calculated by changing the number of Gaussian hole traps. The results were as follows. When the number of deep-level hole traps in the first region was increased, change in the calculated S value with respect to the thickness of the single crystal semiconductor layer was larger than that of FIG. 9A as shown in FIG. 9B. On the contrary, when the number of deep-level hole traps in the first region was decreased, the calculated S value was nearly independent of the thickness of the single crystal semiconductor layer as shown in FIG. 9C. From the results of FIGS. 9A to 9C, it was found that the deep-level hole trap in the first region largely affects the relation between the S value and the thickness of the single crystal semiconductor layer of the p-channel transistor.

Figure 10A:
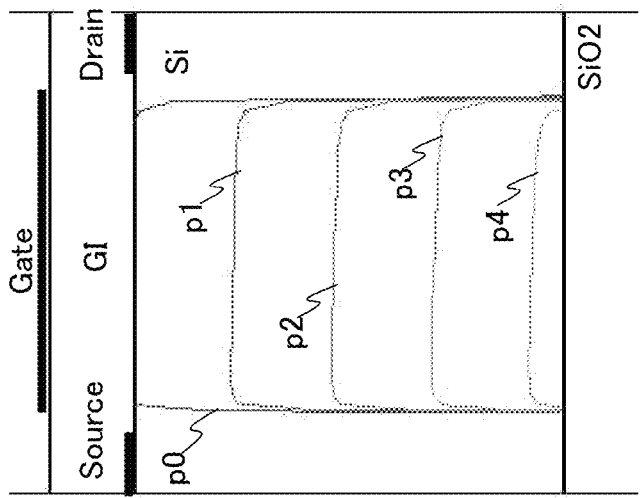
FIGS. 10A to 10F show simulation results of semiconductor devices.
Figure 10B:
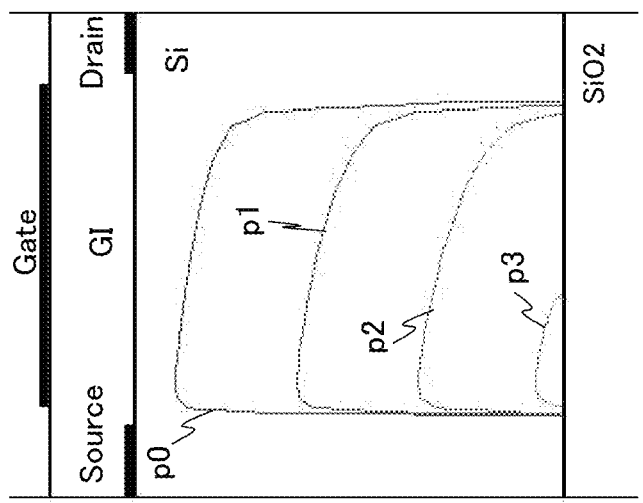
Figure 10C:
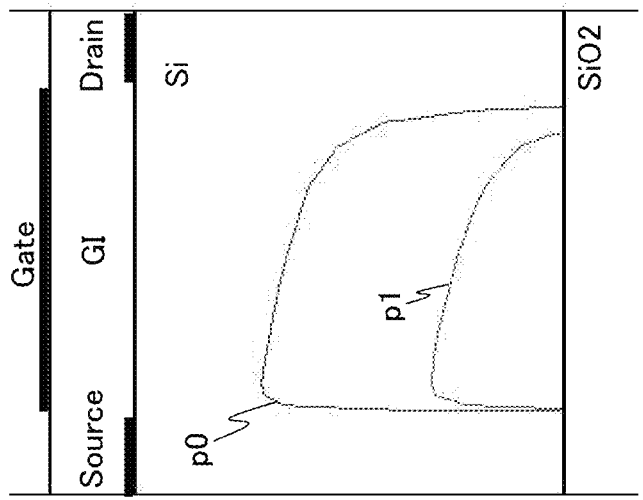
Figure 10D:
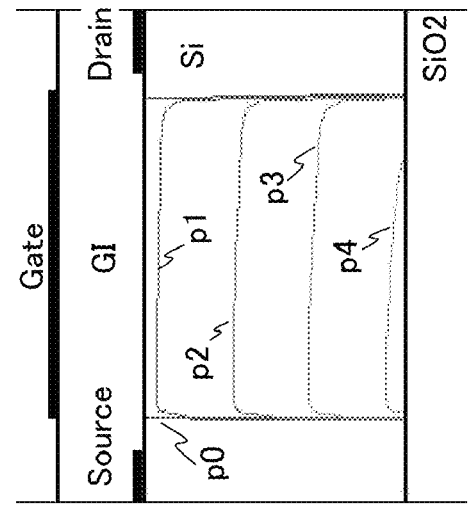
Figure 10E:
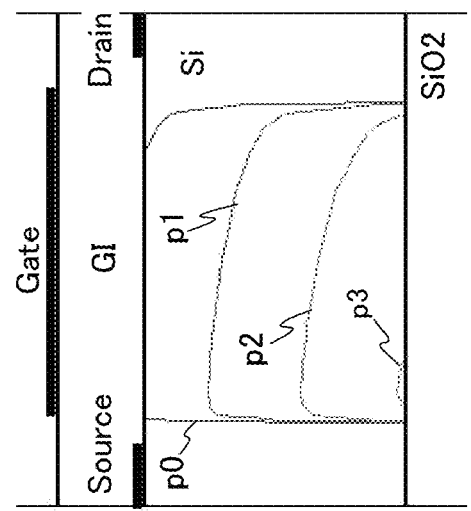
Figure 10F:
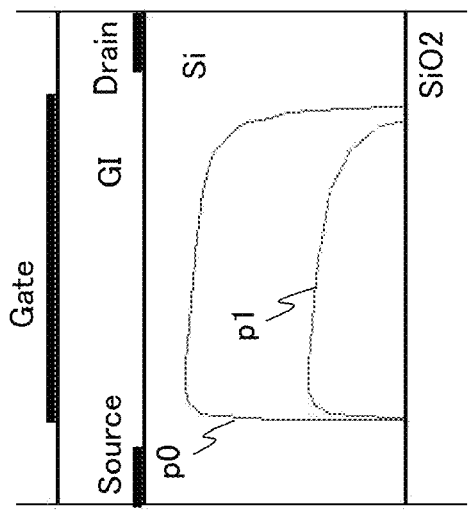

Next, how the deep-level hole trap in the first region affects the S value of the p-channel transistor was investigated. FIGS. 10A to 10F are simulation results showing potential distributions at different hole trap densities. In the drawings, contours p0 to p4 of electron-current density are shown. Here, potential distributions at a gate voltage at which the S value is minimum are shown, where Vg=−0.6 V and Vd=−1.0 V. FIGS. 10B and 10E show simulation results under such conditions as to fit the simulation results to measured results of the transistor manufactured by the present inventors, FIGS. 10A and 10D show simulation results under conditions where the number of hole traps is smaller than that under the conditions of FIGS. 10B and 10E, and FIGS. 10C and 10F show simulation results under conditions where the number of hole traps is larger than that under the conditions of FIGS. 10B and 10E. In addition, FIGS. 10A, 10B, and 10C show simulation results when the thickness of the single crystal semiconductor film is about 100 nm (Condition 1), and FIGS. 10D, 10E, and 10F show simulation results when the thickness of the single crystal semiconductor film is about 60 nm (Condition 2). Accordingly, it could be confirmed by the calculation that the potential distribution varies depending on the hole traps.

By comparison of FIGS. 10A to 10F, it is conceivable that a hole charge is trapped at a hole trap and the S value varies depending on the potential of the trapped hole. That is, when the thickness of the single crystal semiconductor layer is larger, the channel region is farther away from the region including many hole traps; accordingly, the influence of the potential of the trapped hole on the S value becomes smaller.

This potential suppresses field effect of the gate electrode and flow of drain current (rise of the Id-Vg curve), thereby increasing the S value. The reason why the influence on n-channel transistor characteristics is small even when hole carrier traps are generated in a bottom portion of an active layer is because majority carriers of the n-channel transistor are electrons and the effect of electrons on the n-channel transistor characteristics is little. The p-channel transistor is affected because majority carriers thereof are holes.

The present inventors confirmed by the experiment and the simulation in the above-described manner that a smaller S value can be obtained when a single crystal semiconductor layer of an n-channel transistor is thinner and a single crystal semiconductor layer of a p-channel transistor is thicker.

Embodiment 3

A semiconductor device such as a transistor is manufactured using a semiconductor substrate according to the present invention, and a variety of electronic devices can be manufactured using this semiconductor device. Since crystal defects in the single crystal semiconductor layer provided for the semiconductor substrate according to the present invention are reduced, the local state density at an interface with a gate insulating layer can be reduced. By using this single crystal semiconductor layer as an active layer, leakage current is reduced; accordingly, a semiconductor element with improved electric characteristics can be manufactured. That is, by using a semiconductor substrate according to the present invention, a semiconductor element with high current driving capability and high reliability can be manufactured; accordingly, an electronic device as a final product can be manufactured with high throughput and favorable quality. In this embodiment, examples of application to specific electronic devices will be described with reference to the drawings.

As electronic devices manufactured using the semiconductor device (particularly, display device), the following can be given: a camera such as a video camera or a digital camera, a goggle type display (a head mounted display), a navigation system, an audio reproducing device (car audio set, audio component set, or the like), a computer, a game machine, a portable information terminal (mobile computer, cellular phone, portable game machine, electronic book reader, or the like), and an image reproducing device provided with a recording medium (specifically, a device provided with a display device that can reproduce the content of a recording medium such as a digital versatile disc (DVD) and display the image), and the like.

Figure 11A:
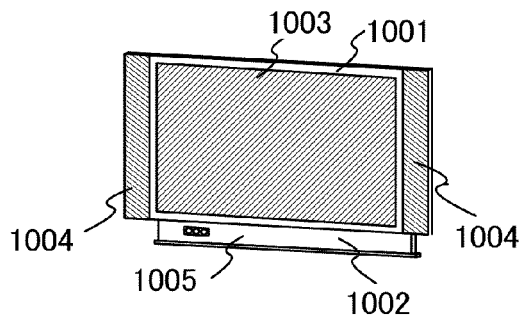
FIGS. 11A to 11H illustrate electronic devices which use a semiconductor device.

FIG. 11A illustrates a television receiver or a monitor of a personal computer, which includes a housing 1001, a support base 1002, a display portion 1003, a speaker portion 1004, a video input terminal 1005, and the like. A semiconductor device of the present invention is used for the display portion 1003. By the present invention, a television set or monitor of a personal computer with high reliability and high performance can be provided at low cost.

Figure 11B:
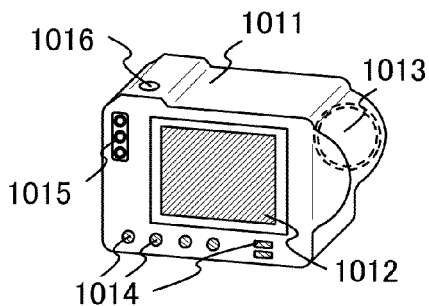

FIG. 11B illustrates a digital camera. An image receiving portion 1013 is provided in the front side of a main body 1011. A shutter button 1016 is provided at the upper portion of the main body 1011. A display portion 1012, operation keys 1014, and an external connection port 1015 are provided at the backside of the main body 1011. A semiconductor device of the present invention is used for the display portion 1012. By the present invention, a digital camera with high reliability and high performance can be provided at low cost.

Figure 11C:
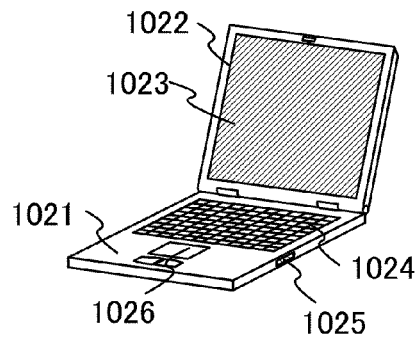

FIG. 11C illustrates a laptop personal computer. A main body 1021 is provided with a keyboard 1024, an external connection port 1025, and a pointing device 1026. A housing 1022 including a display portion 1023 is attached to the main body 1021. A semiconductor device of the present invention is used for the display portion 1023. By the present invention, a laptop personal computer with high reliability and high performance can be provided at low cost.

Figure 11D:
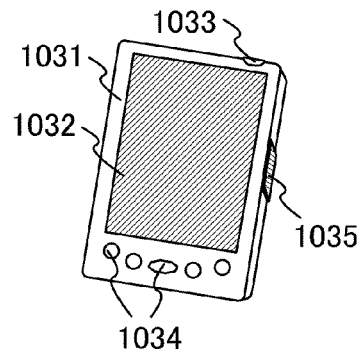

FIG. 11D illustrates a mobile computer, which includes a main body 1031, a display portion 1032, a switch 1033, operation keys 1034, an infrared port 1035, and the like. An active matrix display device is provided for the display portion 1032. A semiconductor device of the present invention is used for the display portion 1032. By the present invention, a mobile computer with high reliability and high performance can be provided at low cost.

Figure 11E:
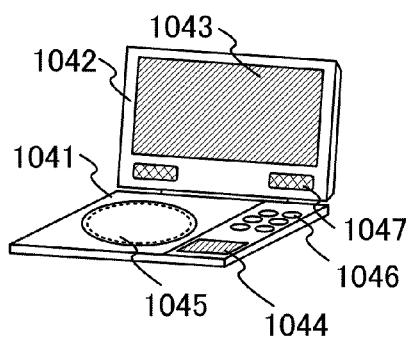

FIG. 11E illustrates an image reproducing device. A main body 1041 is provided with a display portion 1044, a recording medium reading portion 1045, and operation keys 1046. A housing 1042 including a speaker portion 1047 and a display portion 1043 is attached to the main body 1041. A semiconductor device of the present invention is used for each of the display portion 1043 and the display portion 1044. By the present invention, an image reproducing device with high reliability and high performance can be provided at low cost.

Figure 11F:
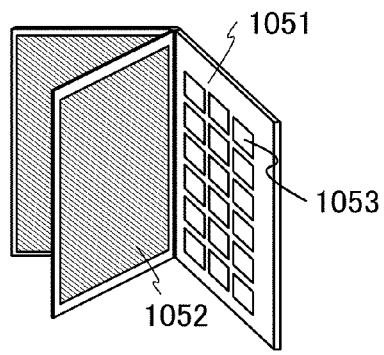

FIG. 11F illustrates an electronic book reader. A main body 1051 is provided with operation keys 1053. A plurality of display portions 1052 are attached to the main body 1051. A semiconductor device of the present invention is used for the display portions 1052. By the present invention, an electronic book reader with high reliability and high performance can be provided at low cost.

Figure 11G:
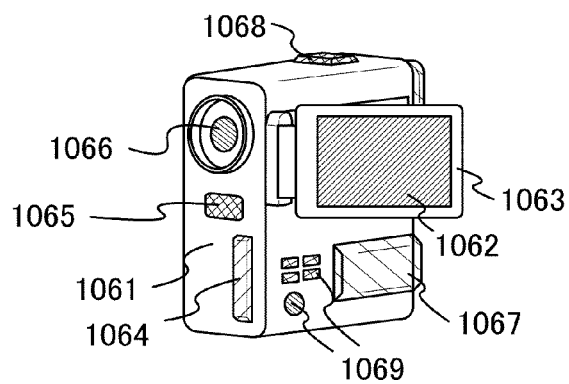

FIG. 11G illustrates a video camera. A main body 1061 is provided with an external connection port 1064, a remote control receiving portion 1065, an image receiving portion 1066, a battery 1067, an audio input portion 1068, and operation keys 1069. A housing 1063 including a display portion 1062 is attached to the main body 1061. A semiconductor device of the present invention is used for the display portion 1062. By the present invention, a video camera with high reliability and high performance can be provided at low cost.

Figure 11H:
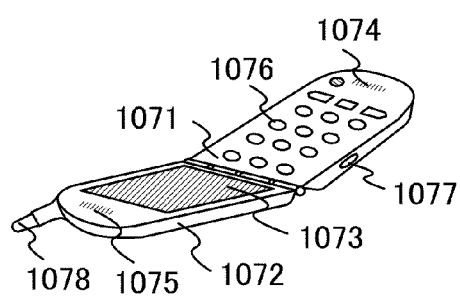

FIG. 11H illustrates a cellular phone, which includes a main body 1071, a housing 1072, a display portion 1073, an audio input portion 1074, an audio output portion 1075, operation keys 1076, an external connection port 1077, an antenna 1078, and the like. A semiconductor device of the present invention is used for the display portion 1073. By the present invention, a cellular phone with high reliability and high performance can be provided at low cost.

Figure 12A:
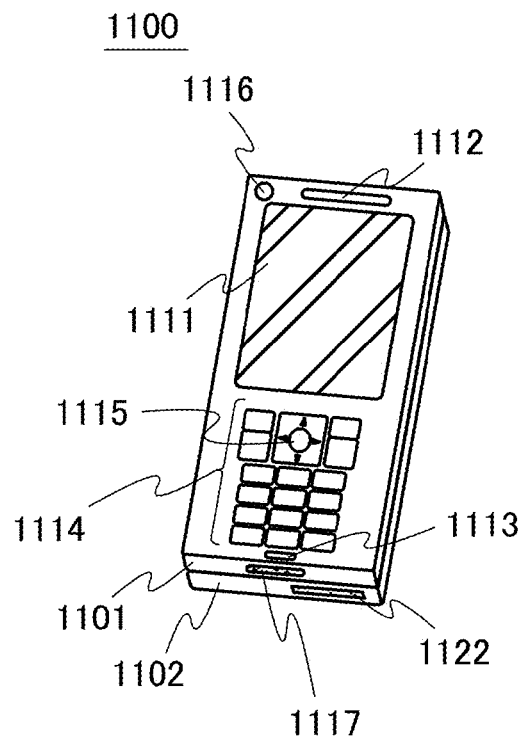
FIGS. 12A to 12C illustrate an electronic device which uses a semiconductor device.
Figure 12B:
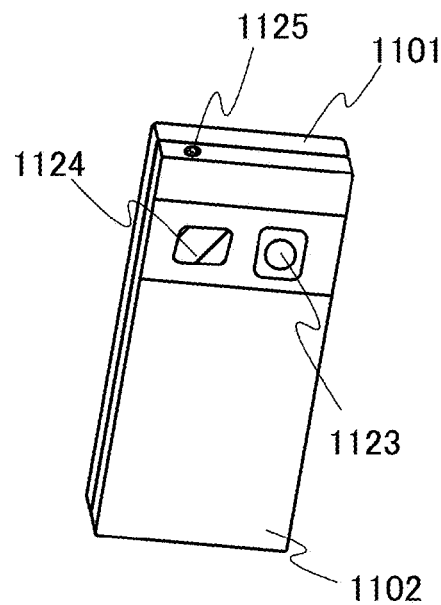
Figure 12C:
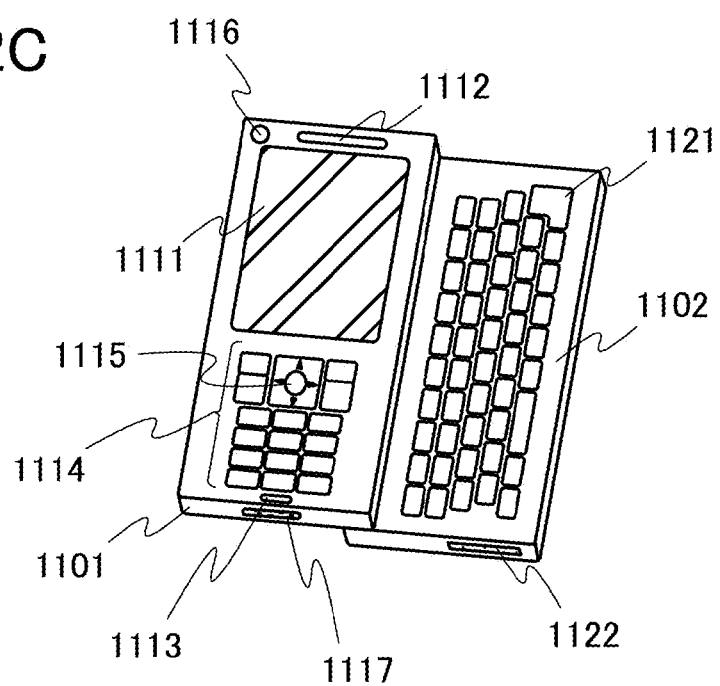

FIGS. 12A to 12C illustrate a structural example of a portable electronic device 1100 having functions as a telephone and an information terminal. FIG. 12A is a front view, FIG. 12B is a back view, and FIG. 12C is a development view. The portable electronic device 1100 has functions as both a telephone and an information terminal and is an electronic device so-called a smartphone which is capable of various data processing in addition to voice call.

The portable electronic device 1100 includes a housing 1101 and a housing 1102. The housing 1101 is provided with a display portion 1111, a speaker 1112, a microphone 1113, operation keys 1114, a pointing device 1115, a lens 1116 for camera, an external connection terminal 1117, and the like. The housing 1102 is provided with a keyboard 1121, an external memory slot 1122, a lens 1123 for camera, a light 1124, an earphone terminal 1125, and the like. In addition, an antenna is incorporated in the housing 1101. In addition to the structure described above, a non-contact IC chip, a small size memory device, or the like can be built therein.

A semiconductor device of the present invention is incorporated in the display portion 1111. An image displayed (and direction in which the image is displayed) in the display portion 1111 variously changes with respect to the usage pattern of the portable electronic device 1100. In addition, because the camera lens 1116 is provided in the same plane as the display portion 1111, voice calls together with visual images (so-called videophone calls) are possible. Note that the speaker 1112 and the microphone 1113 can be used not only for voice call but also for recording, reproducing, or the like. In the case where a still image and a moving image are shot using the lens 1123 for camera (and the light 1124), the display portion 1111 is used as a finder. The operation keys 1114 are used for incoming/outgoing of phone call, inputting simple information such as e-mail, screen scrolling, moving cursor, and the like.

The housing 1101 and the housing 1102 overlapped with each other (FIG. 12A) slide and can be developed as illustrated in FIG. 12C, so that the portable electronic device 1100 can be used as an information terminal. In that case, smooth operation with the keyboard 1121 and the pointing device 1115 can be performed. The external connection terminal 1117 can be connected to various cables such as an AC adopter or a USB cable, whereby the portable electronic device 1117 can be charged or can perform data communication with a computer or the like. Moreover, by inserting a recording medium into the external memory slot 1122, the portable electronic device 1100 can deal with storing and moving data with higher capacity. In addition to the functions described above, a function of wireless communication using electromagnetic waves such as infrared rays, a function of receiving television, and the like may be included. By the present invention, a portable electronic device with high reliability and high performance can be provided at low cost.

As described above, the application range of the present invention is so wide that the present invention can be applied to electronic devices in a variety of fields. This embodiment can be implemented in combination with Embodiment 1 or 2 as appropriate.

This application is based on Japanese Patent Application serial no. 2008-109180 filed with Japan Patent Office on Apr. 18, 2008, the entire contents of which are hereby incorporated by reference.

What is claimed is:

1. A manufacturing method of a semiconductor device, comprising the steps of:
    forming an embrittlement region in a single crystal semiconductor substrate;
    attaching and fixing the single crystal semiconductor substrate to a substrate;
    generating a crack in the embrittlement region by heating the single crystal semiconductor substrate, thereby separating from a part of the single crystal semiconductor substrate to form a semiconductor layer, wherein the semiconductor layer is attached to the substrate;
    forming a first island-shaped semiconductor layer and a second island-shaped semiconductor layer from the semiconductor layer;
    adding an impurity element imparting n-type conductivity into part of the first island-shaped semiconductor layer to form a first source region and a first drain region; and
    adding an impurity element imparting p-type conductivity into part of the second island-shaped semiconductor layer to form a second source region and a second drain region,
    wherein a thickness of the first source region is thinner than a thickness of the second source region, and
    wherein a thickness of the first drain region is thinner than a thickness of the second drain region.

2. The manufacturing method of a semiconductor device according to claim 1, further comprising the step of forming an n-type transistor including the first island-shaped semiconductor layer and a p-type transistor including the second island-shaped semiconductor layer.

3. The manufacturing method of a semiconductor device according to claim 1, further comprising the step of performing heat treatment so that the substrate and the single crystal semiconductor substrate are bonded to each other more efficiently.

4. The manufacturing method of a semiconductor device according to claim 3, wherein the heat treatment is performed by irradiating a region relating to bonding of the substrate and the single crystal semiconductor substrate with microwave.

5. The manufacturing method of a semiconductor device according to claim 1, further comprising the step of forming a first silicide layer in the first source region, a second silicide layer in the first drain region, a third silicide layer in the second source region, and a fourth silicide layer in the second drain region.

6. The manufacturing method of a semiconductor device according to claim 5, wherein a metal included in the first to fourth silicide layers is selected from the group consisting of titanium, nickel, tungsten, molybdenum, cobalt, zirconium, hafnium, tantalum, vanadium, neodymium, chromium, platinum, and palladium.

7. The manufacturing method of a semiconductor device according to claim 1, further comprising the step of irradiating the semiconductor layer with a laser beam to recrystallize the semiconductor layer.

8. The manufacturing method of a semiconductor device according to claim 1, further comprising the step of forming an insulating layer over the substrate or the single crystal semiconductor substrate,
    wherein the insulating layer is interposed between the substrate and the semiconductor layer.

9. A manufacturing method of a semiconductor device, comprising the steps of:
    forming an embrittlement region in a single crystal semiconductor substrate;
    attaching and fixing the single crystal semiconductor substrate to a substrate;
    generating a crack in the embrittlement region by heating the single crystal semiconductor substrate, thereby separating from a part of the single crystal semiconductor substrate to form a semiconductor layer, wherein the semiconductor layer is attached to the substrate;
    separating the semiconductor layer into a first island-shaped semiconductor layer and a second island-shaped semiconductor layer;
    etching the first island-shaped semiconductor layer by using a mask;
    adding an impurity element imparting n-type conductivity into part of the first island-shaped semiconductor layer to form a first source region and a first drain region by using the mask; and
    adding an impurity element imparting p-type conductivity into part of the second island-shaped semiconductor layer to form a second source region and a second drain region,
    wherein a thickness of the first source region is thinner than a thickness of the second source region, and wherein a thickness of the first drain region is thinner than a thickness of the second drain region.

10. The manufacturing method of a semiconductor device according to claim 9, further comprising the step of forming an n-type transistor including the first island-shaped semiconductor layer and a p-type transistor including the second island-shaped semiconductor layer.

11. The manufacturing method of a semiconductor device according to claim 9, further comprising the step of performing heat treatment so that the substrate and the single crystal semiconductor substrate are bonded to each other more efficiently.

12. The manufacturing method of a semiconductor device according to claim 11, wherein the heat treatment is performed by irradiating a region relating to bonding of the substrate and the single crystal semiconductor substrate with microwave.

13. The manufacturing method of a semiconductor device according to claim 9, further comprising the step of forming a first silicide layer in the first source region, a second silicide layer in the first drain region, a third silicide layer in the second source region, and a fourth silicide layer in the second drain region.

14. The manufacturing method of a semiconductor device according to claim 13, wherein a metal included in the first to fourth silicide layers is selected from the group consisting of titanium, nickel, tungsten, molybdenum, cobalt, zirconium, hafnium, tantalum, vanadium, neodymium, chromium, platinum, and palladium.

15. The manufacturing method of a semiconductor device according to claim 9, further comprising the step of irradiating the semiconductor layer with a laser beam to recrystallize the semiconductor layer.

16. The manufacturing method of a semiconductor device according to claim 9, further comprising the step of forming an insulating layer over the substrate or the single crystal semiconductor substrate,
wherein the insulating layer is interposed between the substrate and the semiconductor layer.

17. A manufacturing method of a semiconductor device, comprising the steps of:
forming an embrittlement region in a single crystal semiconductor substrate;
attaching and fixing the single crystal semiconductor substrate to a substrate;
generating a crack in the embrittlement region by heating the single crystal semiconductor substrate, thereby separating from a part of the single crystal semiconductor substrate to form a semiconductor layer, wherein the semiconductor layer is attached to the substrate;
separating the semiconductor layer into a first island-shaped semiconductor layer and a second island-shaped semiconductor layer;
etching the first island-shaped semiconductor layer by using a first mask;
forming a gate insulating film over the first island-shaped semiconductor layer and the second island-shaped semiconductor layer;
forming a first gate electrode over the first island-shaped semiconductor layer and a second gate electrode over the second island-shaped semiconductor layer;
adding an impurity element imparting n-type conductivity into part of the first island-shaped semiconductor layer to form a first source region and a first drain region by using the first mask and the first gate electrode as a second mask; and
adding an impurity element imparting p-type conductivity into part of the second island-shaped semiconductor layer to form a second source region and a second drain region by using the second gate electrode as a third mask,
wherein a thickness of the first source region is thinner than a thickness of the second source region, and
wherein a thickness of the first drain region is thinner than a thickness of the second drain region.

18. The manufacturing method of a semiconductor device according to claim 17, further comprising the step of performing heat treatment so that the substrate and the single crystal semiconductor substrate are bonded to each other more efficiently.

19. The manufacturing method of a semiconductor device according to claim 18, wherein the heat treatment is performed by irradiating a region relating to bonding of the substrate and the single crystal semiconductor substrate with microwave.

20. The manufacturing method of a semiconductor device according to claim 17, further comprising the step of forming a first silicide layer in the first source region, a second silicide layer in the first drain region, a third silicide layer in the second source region, and a fourth silicide layer in the second drain region.

21. The manufacturing method of a semiconductor device according to claim 20, wherein a metal included in the first to fourth silicide layers is selected from the group consisting of titanium, nickel, tungsten, molybdenum, cobalt, zirconium, hafnium, tantalum, vanadium, neodymium, chromium, platinum, and palladium.

22. The manufacturing method of a semiconductor device according to claim 17, further comprising the step of irradiating the semiconductor layer with a laser beam to recrystallize the semiconductor layer.

23. The manufacturing method of a semiconductor device according to claim 17, further comprising the step of forming an insulating layer over the substrate or the single crystal semiconductor substrate,
wherein the insulating layer is interposed between the substrate and the semiconductor layer.

24. The manufacturing method of a semiconductor device according to claim 17, wherein the gate insulating film includes hydrogen.

25. The manufacturing method of a semiconductor device according to claim 17, wherein the gate insulating film is formed by oxidizing or nitriding the first island-shaped semiconductor layer and the second island-shaped semiconductor layer by high-density plasma treatment.

* * * * *